(12) United States Patent
Wu et al.

(10) Patent No.: US 7,781,351 B1
(45) Date of Patent: Aug. 24, 2010

(54) METHODS FOR PRODUCING LOW-K CARBON DOPED OXIDE FILMS WITH LOW RESIDUAL STRESS

(75) Inventors: Qingguo Wu, Tualatin, OR (US); Haiying Fu, West Linn, OR (US); Dong Niu, Tualatin, OR (US); Ananda K. Bandyopadhyay, West Linn, OR (US); David Mordo, Cupertino, CA (US)

(73) Assignee: Novellus Systems, Inc., San Jose, CA (US)

( * ) Notice: Subject to any disclaimer, the term of this patent is extended or adjusted under 35 U.S.C. 154(b) by 513 days.

(21) Appl. No.: 10/820,525

(22) Filed: Apr. 7, 2004

(51) Int. Cl.
*H01L 21/31* (2006.01)

(52) U.S. Cl. ............... 438/789; 438/788; 438/790; 257/E21.277

(58) Field of Classification Search .......... 438/778, 438/780, 788, 789, 790; 257/E21.277, E21.494, 257/E21.273
See application file for complete search history.

(56) References Cited

U.S. PATENT DOCUMENTS

| | | |
|---|---|---|
| 4,357,451 A | 11/1982 | McDaniel |
| 4,837,185 A | 6/1989 | Yau et al. |
| 4,882,008 A | 11/1989 | Garza et al. |
| 4,885,262 A | 12/1989 | Ting et al. |
| 4,968,384 A | 11/1990 | Asano |
| 5,281,546 A | 1/1994 | Possin et al. |
| 5,504,042 A | 4/1996 | Cho et al. .................. 438/781 |
| 5,648,175 A | 7/1997 | Russell et al. |
| 5,686,054 A | 11/1997 | Barthel et al. |
| 5,700,844 A | 12/1997 | Hedrick et al. .............. 521/77 |
| 5,789,027 A | 8/1998 | Watkins et al. ............. 427/250 |
| 5,849,640 A | 12/1998 | Hsia et al. .................. 438/734 |
| 5,851,715 A | 12/1998 | Barthel et al. |
| 5,858,457 A | 1/1999 | Brinker et al. .............. 427/162 |
| 5,920,790 A | 7/1999 | Wetzel et al. |
| 6,140,252 A | 10/2000 | Cho et al. |
| 6,149,828 A | 11/2000 | Vaartstra |
| 6,171,661 B1 | 1/2001 | Zheng et al. ................ 427/535 |
| 6,177,329 B1 | 1/2001 | Pang |
| 6,232,658 B1 | 5/2001 | Catabay et al. ............. 257/701 |
| 6,258,735 B1 | 7/2001 | Xia et al. .................... 438/788 |
| 6,268,276 B1 | 7/2001 | Chan et al. |
| 6,268,288 B1 | 7/2001 | Hautala et al. |
| 6,270,846 B1 | 8/2001 | Brinker et al. ............. 428/64.1 |
| 6,271,273 B1 | 8/2001 | You et al. |
| 6,306,564 B1 | 10/2001 | Mullee |
| 6,312,793 B1 | 11/2001 | Grill et al. |
| 6,329,017 B1 | 12/2001 | Liu et al. .................... 427/240 |
| 6,329,062 B1 | 12/2001 | Gaynor |
| 6,331,480 B1 | 12/2001 | Tsai et al. |
| 6,340,628 B1 | 1/2002 | Van Cleemput et al. ..... 438/586 |
| 6,365,266 B1 | 4/2002 | MacDougall et al. ...... 428/304.4 |
| 6,365,528 B1 | 4/2002 | Sukharev et al. |
| 6,383,466 B1 | 5/2002 | Domansky et al. .......... 423/335 |
| 6,383,955 B1 | 5/2002 | Matsuki et al. ............. 438/790 |
| 6,386,466 B1 | 5/2002 | Ozawa et al. |
| 6,387,453 B1 | 5/2002 | Brinker et al. .............. 427/387 |
| 6,391,932 B1 | 5/2002 | Gore et al. .................. 521/61 |
| 6,392,017 B1 | 5/2002 | Chandrashekar |
| 6,407,013 B1 | 6/2002 | Li et al. |
| 6,410,462 B1 | 6/2002 | Yang et al. |
| 6,413,583 B1 | 7/2002 | Moghadam et al. |
| 6,420,441 B1 | 7/2002 | Allen et al. |
| 6,436,824 B1 * | 8/2002 | Chooi et al. ................. 438/687 |
| 6,444,715 B1 | 9/2002 | Mukherjee et al. |
| 6,455,417 B1 | 9/2002 | Bao et al. .................... 438/637 |
| 6,465,366 B1 | 10/2002 | Nemani et al. |
| 6,479,374 B1 | 11/2002 | Ioka et al. |
| 6,479,409 B2 | 11/2002 | Shioya et al. |
| 6,500,770 B1 | 12/2002 | Cheng et al. ................ 438/782 |
| 6,548,113 B1 | 4/2003 | Birnbaum et al. |
| 6,558,755 B2 | 5/2003 | Berry et al. |

(Continued)

FOREIGN PATENT DOCUMENTS

| | | |
|---|---|---|
| WO | WO95/07543 | 3/1995 |
| WO | WO 03/005429 | 1/2003 |
| WO | WO 03/052794 | 6/2003 |

OTHER PUBLICATIONS

Jan, C.H., et al, *90NM Generation, 300mm Wafer Low k ILD/Cu Interconnect Technology*, 2003 IEEE Interconnect Technology Conference.
U.S. Appl. No. 10/789,103, entitled: Methods for Producing Low-K CDO Films With Low Residual Stress, Wu et al.
U.S. Appl. No. 10/800,409, entitled: Methods for Producing Low-K CDO Films, Wu et al.
Cho et al., "Plasma Treatments of Molecularly Templated Nanoporous Silica Films," Electrochemical and Solid-State Letters, 4 (4) G35-G38 (2001).
Yung et al., "Spin-on Mesoporous Silica Films with Ultralow Dielectric Constants, Ordered Pore Structures, and Hydrophobic Surfaces," Adv. Mater. 2001, 13, No. 14, 1099-1102.
Schulberg et al., "System for Deposition of Mesoporous Materials," U.S. Appl. No. 10/295,965, filed Nov. 15, 2002, 64 Pages.
Watkins et al., "Mesoporous Materials and Methods," U.S. Appl. No. 10/301,013, filed Nov. 21, 2002, 34 Pages.

(Continued)

*Primary Examiner*—Julio J Maldonado
(74) *Attorney, Agent, or Firm*—Weaver Austin Villeneuve & Sampson LLP

(57) ABSTRACT

Methods of preparing a carbon doped oxide (CDO) layer of low dielectric constant and low residual stress involving, for instance, providing a substrate to a deposition chamber and exposing it to an organosilicon precursor containing unsaturated C—C bonds or to multiple organic precursors including at least one organosilicon and at least one unsaturated C—C bond are provided. The methods may also involve igniting and maintaining a plasma in a deposition chamber using radio frequency power having high and low frequency components with a high percentage of the low frequency component, and depositing the carbon doped dielectric layer under conditions in which the resulting dielectric layer has a residual stress of not greater than, e.g., about 50 MPa, and a dielectric constant not greater than about 3.

30 Claims, 16 Drawing Sheets

U.S. PATENT DOCUMENTS

| | | | |
|---|---|---|---|
| 6,566,278 B1 | 5/2003 | Harvey et al. | |
| 6,570,256 B2 | 5/2003 | Conti et al. | |
| 6,572,925 B2 | 6/2003 | Zubkov et al. | |
| 6,573,030 B1 | 6/2003 | Fairbairn et al. | 430/323 |
| 6,576,300 B1 | 6/2003 | Berry et al. | |
| 6,576,345 B1 | 6/2003 | Cleemput et al. | |
| 6,596,467 B2 | 7/2003 | Gallagher et al. | |
| 6,596,654 B1 | 7/2003 | Bayman et al. | 438/788 |
| 6,610,362 B1 | 8/2003 | Towle | 427/255.23 |
| 6,632,478 B2 | 10/2003 | Gaillard et al. | 427/255.37 |
| 6,662,631 B2 | 12/2003 | Baklanov et al. | |
| 6,667,147 B2 | 12/2003 | Gallagher et al. | |
| 6,677,251 B1 | 1/2004 | Lu et al. | |
| 6,713,407 B1 | 3/2004 | Cheng et al. | |
| 6,715,498 B1 | 4/2004 | Humayun et al. | 134/1.3 |
| 6,740,602 B1 | 5/2004 | Hendriks et al. | |
| 6,756,085 B2 | 6/2004 | Waldfried et al. | |
| 6,759,098 B2 | 7/2004 | Han et al. | |
| 6,797,643 B2 | 9/2004 | Rocha-Alvarez et al. | 438/758 |
| 6,805,801 B1 | 10/2004 | Humayun et al. | |
| 6,812,043 B2 | 11/2004 | Bao et al. | |
| 6,815,373 B2 | 11/2004 | Singh et al. | 438/787 |
| 6,831,284 B2 | 12/2004 | Demos et al. | |
| 6,846,380 B2 | 1/2005 | Dickinson et al. | 156/345.31 |
| 6,848,458 B1 | 2/2005 | Shrinivasan et al. | |
| 6,849,549 B1 | 2/2005 | Chiou et al. | 438/692 |
| 6,867,086 B1 | 3/2005 | Chen et al. | 438/219 |
| 6,890,850 B2 | 5/2005 | Lee et al. | |
| 6,903,004 B1 | 6/2005 | Spencer et al. | 438/624 |
| 6,914,014 B2 | 7/2005 | Li et al. | 438/781 |
| 6,921,727 B2 | 7/2005 | Chiang et al. | |
| 6,943,121 B2 | 9/2005 | Leu et al. | |
| 7,018,918 B2 | 3/2006 | Kloster et al. | 438/623 |
| 7,064,088 B2 * | 6/2006 | Hyodo et al. | 438/787 |
| 7,087,271 B2 * | 8/2006 | Rhee et al. | 427/577 |
| 7,094,713 B1 | 8/2006 | Niu et al. | |
| 7,098,149 B2 | 8/2006 | Lukas et al. | |
| 7,166,531 B1 | 1/2007 | van den Hoek et al. | |
| 7,176,144 B1 | 2/2007 | Wang et al. | |
| 7,208,389 B1 | 4/2007 | Tipton et al. | |
| 7,473,653 B1 | 6/2007 | Wu et al. | |
| 7,241,704 B1 | 7/2007 | Wu et al. | |
| 7,288,292 B2 | 10/2007 | Gates et al. | |
| 7,326,444 B1 | 2/2008 | Wu et al. | |
| 7,341,761 B1 | 3/2008 | Wu et al. | |
| 7,381,659 B2 | 6/2008 | Nguyen et al. | |
| 7,381,662 B1 | 6/2008 | Niu et al. | |
| 7,390,537 B1 | 6/2008 | Wu et al. | |
| 2002/0001973 A1 | 1/2002 | Wu et al. | |
| 2002/0016085 A1 | 2/2002 | Huang et al. | 438/798 |
| 2002/0034626 A1 | 3/2002 | Liu et al. | |
| 2002/0064341 A1 | 5/2002 | Fauver et al. | 385/25 |
| 2002/0106500 A1 | 8/2002 | Albano et al. | |
| 2002/0123240 A1 | 9/2002 | Gallagher et al. | 438/781 |
| 2002/0132496 A1 | 9/2002 | Ball et al. | |
| 2002/0141024 A1 | 10/2002 | Retschke et al. | 359/204 |
| 2002/0172766 A1 | 11/2002 | Laxman et al. | |
| 2002/0192980 A1 | 12/2002 | Hogle et al. | 438/778 |
| 2003/0064154 A1 * | 4/2003 | Laxman et al. | 427/255.28 |
| 2003/0064607 A1 | 4/2003 | Leu et al. | |
| 2003/0066544 A1 | 4/2003 | Jur et al. | |
| 2003/0111263 A1 | 6/2003 | Fornof et al. | |
| 2003/0119307 A1 | 6/2003 | Bekiaris et al. | |
| 2003/0157248 A1 | 8/2003 | Watkins et al. | 427/256 |
| 2003/0198895 A1 | 10/2003 | Toma et al. | 430/314 |
| 2003/0203652 A1 | 12/2003 | Bao et al. | |
| 2003/0224156 A1 | 12/2003 | Kimer et al. | |
| 2004/0018717 A1 | 1/2004 | Fornof et al. | |
| 2004/0069410 A1 | 4/2004 | Moghadam et al. | |
| 2004/0096586 A1 | 5/2004 | Schulberg et al. | 427/372.2 |
| 2004/0096593 A1 | 5/2004 | Lukas et al. | 427/558 |
| 2004/0096672 A1 | 5/2004 | Lukas et al. | |
| 2004/0099952 A1 | 5/2004 | Goodner et al. | |
| 2004/0101633 A1 | 5/2004 | Zheng et al. | 427/551 |
| 2004/0102031 A1 | 5/2004 | Kloster et al. | |
| 2004/0102032 A1 | 5/2004 | Kloster et al. | |
| 2004/0161532 A1 | 8/2004 | Kloster et al. | 427/240 |
| 2004/0166240 A1 | 8/2004 | Rhee et al. | |
| 2004/0170760 A1 | 9/2004 | Meagley et al. | 427/248.1 |
| 2004/0185679 A1 | 9/2004 | Ott et al. | |
| 2004/0213911 A1 | 10/2004 | Misawa et al. | |
| 2004/0249006 A1 | 12/2004 | Gleason et al. | |
| 2005/0025892 A1 | 2/2005 | Satoh et al. | |
| 2005/0064698 A1 | 3/2005 | Chang et al. | 438/623 |
| 2005/0095840 A1 | 5/2005 | Bhanap et al. | |
| 2005/0156285 A1 * | 7/2005 | Gates et al. | 257/632 |
| 2005/0230834 A1 | 10/2005 | Schmitt et al. | |
| 2005/0260357 A1 | 11/2005 | Zheng et al. | |
| 2006/0024976 A1 | 2/2006 | Waldfried et al. | |
| 2006/0027929 A1 | 2/2006 | Cooney et al. | |
| 2006/0040507 A1 | 2/2006 | Mak et al. | |
| 2006/0105566 A1 | 5/2006 | Waldfried et al. | |
| 2006/0110931 A1 * | 5/2006 | Fukazawa et al. | 438/758 |
| 2006/0145304 A1 | 7/2006 | Boyanov et al. | |
| 2006/0145305 A1 | 7/2006 | Boyanov et al. | |
| 2006/0178006 A1 | 8/2006 | Xu et al. | |
| 2006/0197881 A1 | 9/2006 | Kang et al. | |
| 2008/0009141 A1 | 1/2008 | Dubois et al. | |
| 2008/0132055 A1 | 6/2008 | Nguyen et al. | |
| 2008/0194105 A1 | 8/2008 | Dominquez et al. | |

OTHER PUBLICATIONS

Justin F. Gaynor, "In-Situ Treatment of Low-K Films With a Silylating Agent After Exposure to Oxidizing Environments," U.S. Appl. No. 10/056,926, filed Jan. 24, 2002, 34 Pages.

Humayun et al., "Method for Forming Porous Films By Porogen Removel Combined Wtih In SITU Surface Modification", Novellus Corporation, U.S. Appl. No. 10/404,693, filed Mar. 31, 2003, pp. 1-32.

Tipton et al., "Method Of Porogen Removal From Porous Low-K Films Using UV Radiation", Novellus Systems, Inc., U.S. Appl. No. 10/672,311, filed Sep. 26, 2003, pp. 1-27.

U.S. Appl. No. 10/016,017, filed Dec. 12, 2001.

U.S. Appl. No. 10/125,614, filed Apr. 18, 2002.

U.S. Appl. No. 10/202,987, filed Jul. 23, 2002.

Tipton et al., "Method for Removal of Porogens From Porous Low-K Films Using Supercritical Fluids", Novellus Systems, Inc., U.S. Appl. No. 10/672,305, filed Sep. 26, 2003, pp. 1-32.

Gangpadhyay et al., "The First International Surface Cleaning Workshop," Northeastern University, Nov. 11-14, 2002.

Cho et al., "Method and Apparatus for UV Exposure of Low Dielectric Constant Materials for Porogen Removal and Improved Mechanical Properties", Novellus Systems, Inc., U.S. Appl. No. 10/800,377, filed Mar. 11, 2004, pp. 1-31.

Wu et al., "Method and Apparatus of UV Exposure of Low Dielectric Constant Materials for Porogen Removal and Improved Mechanical Properties", Novellus Systems, Inc., U.S. Appl. No. 10/807,680, filed Mar. 23, 2004, pp. 1-34.

Humayun et al., "Method For Forming Porous Films By Porogen Removal Combined With In Situ Modification", U.S. Appl. No. 10/404,693, filed Mar. 31, 2003, Office Action dated Mar. 15, 2005.

Tipton et al., "Method Of Porogen Removal From Porous Low-K Films Using UV Radiation", U.S. Appl. No. 10/672,311, filed Sep. 26, 2003, Office Action dated Sep. 7, 2004.

Tipton et al., "Method Of Porogen Removal From Porous Low-K Films Using UV Radiation", U.S. Appl. No. 10/672,311, filed Sep. 26, 2003, Office Action dated Dec. 28, 2004.

Tipton et al., "Method For Removal Of Porogens From Porous Low-K Films Using Supercritical Fluids", U.S. Appl. No. 10/672,305, Office Action dated Mar. 22, 2005.

Bandyopadhyay et al., "Method to Improve Mechanical Strength of Low-K Dielectric Film Using Modulated UV Exposure", U.S. Appl. No. 10/825,888, filed Apr. 16, 2004.

R.D. Miller et al., "Phase-Separated Inorganic-Organic Hybrids for Microelectronic Applications," MRS Bulletin, Oct. 1997, pp. 44-48.

Jin et al., "Nanoporous Silica as an Ultralow-$k$ Dielectric," MRS Bulletin, Oct. 1997, pp. 39-42.

Asoh et al., "Fabrication of Ideally Ordered Anodic Porous Alumina with 63 nm Hole Periodocity Using Sulfuric Acid," J. Vac. Sci. Technol. B 19(2), Mar./Apr. 2001, pp. 569-572.

Asoh et al., "Conditions for Fabrication of Ideally Ordered Anodic Porous Alumina Using Pretextured Al," Journal of the Electrochemica Society, 148 (4) B152-B156 (2001) pp. B152-B156.

Holland et al., "Nonlithographic Technique for the Production of Large Area High Density Gridded Field Sources," J. Vac. Sci. Technol. B 17(2), Mar./Apr. 1999, pp. 580-582.

Masuda et al. "Highly Ordered Nanochannel-Array Architecture in Anodic Alumina," App. Phys. Lett. 71(19), Nov. 1997, pp. 2770-2772.

Clube et al., White Paper from Holotronic Technologies SA; downloaded from www.hdotronic.com/whitepaper/fine-patt.pdf on Mar. 12, 2002.

Meli et al., "Self-Assembled Masks for the Transfer of Nanometer-Scale Patterns into Surfaces: Characterization by AFM and LFM", Nano Letters, vol. 2, No. 2, 2002, 131-135.

"Shipley Claims Porous Low K Dielectric Breakthrough," Press Release Mar. 17, 2003.

Jeffrey M. Calvert and Michael K. Gallagher, Semiconductor International, 26 (12), 56 (2003).

Van Bavel et al., Future Fab International, 16, (2004).

Caluwaerts et al, "Post Patterning Meso Porosity Creation: A Potential Solution for Pore Sealing," IITC 2003.

Peter Singer, "New Materials and Designs to Improve Transistor Performance", Apr. 1, 2004, Semiconductor International.

Ghani et al, "A 90nm High Volume Manufacturing Logic Technology Featuring Novel 45nm Gate Length Strained Silicon CMOS Transistors", IEEE, © 2003.

Bhadri N. Varadarajan, "Tensile Silicon Nitride—P1264 NESL", C & F Study, Aug. 21, 2003.

Varadarajan, et al., "Strained Transistor Architecture and Method", Novellus Systems, Inc., U.S. Appl. No. 10/923,259, filed Aug. 20, 2004, pp. 1-24.

Niu et al., "Methods For Improving The Cracking Resistance Of Low-K Dielectric Materials", U.S. Appl. No. 10/860,340, filed Jun. 2, 2004.

Niu et al., "Methods For Improving The Cracking Resistance Of Low-K Dielectric Materials", U.S. Appl. No. 10/860,340, Office Action dated Mar. 2, 2005.

Niu et al., "Methods For Improving The Cracking Resistance Of Low-K Dielectric Materials", U.S. Appl. No. 10/860,340, Final Office Action dated Jun. 13, 2005.

Wang et al., "Plasma Detemplating And Silanol Capping Of Porous Dielectric Films", U.S. Appl. No. 10/785,235, filed Feb. 23, 2004.

Varadarajan et al., "Tensile Dielectric Films Using UV Curing", U.S. Appl. No. 10/972,084, filed Oct. 22, 2004.

Fox et al., "Method For Improving Mechanical Properties Of Low Dielectric Constant Materials", U.S. Appl. No. 10/849,568, filed May 18, 2004.

Fox et al., "Methods For Producing Low-Stress Carbon-Doped Oxide Films With Improved Integration Properties", U.S. Appl. No. 10/987,208, filed Nov. 12, 2004.

Van Den Hoek et al., "VLSI Fabrication Processes For Introducing Pores Into Dielectric Materials," U.S. Appl. No. 11/050,621, filed Jan. 31, 2005.

Draeger et al., "Creation Of Porosity In Low-K Films By Photo-Disassociation Of Imbedded Nanoparticles," U.S. Appl. No. 11/146,456, filed Jun. 6, 2005.

Wu et al., "Methods For Producing Low Stress Porous Low-K Dielectric Materials Using Precursors With Organic Functional Groups", U.S. Appl. No. 10/927,777, filed Aug. 27, 2004.

Wu et al., "Methods For Improving Integration Performance Of Low Stress CDO Films", U.S. Appl. No. 10/941,502, filed Sep. 14, 2004.

Cho et al., "Methods of Improving Porogen Removal and Film Mechanical Strength in Producing Ultra Low-K Carbon Doped Oxide Films Using Radical Photopolymerization", U.S. Appl. No. 10/982,654, filed Nov. 5, 2004.

U.S. Office Action mailed Jul. 13, 2005, from U.S. Appl. No. 10/672,311.

U.S. Office Action mailed Jul. 27, 2005, from U.S. Appl. No. 10/785,235.

U.S. Office Action mailed Aug. 24, 2005, from U.S. Appl. No. 10/404,693.

U.S. Office Action mailed Sep. 1, 2005, from U.S. Appl. No. 10/672,305.

Cho et al., "Method for Porogen Removal and Mechanical Strength Enhancement of Low-K Carbon Doped Silicon Oxide Using Low Thermal Budget Microwave Curing", U.S. Appl. No. 11/280,113, filed Nov. 15, 2005.

U.S. Office Action mailed Dec. 27, 2005, from U.S. Appl. No. 10/789,103.

U.S. Office Action mailed Dec. 23, 2005, from U.S. Appl. No. 10/800,409.

U.S. Office Action mailed Feb. 7, 2006, from U.S. Appl. No. 10/672,305.

U.S. Office Action mailed Dec. 20, 2005, from U.S. Appl. No. 10/672,311.

U.S. Office Action mailed Dec. 20, 2005, from U.S. Appl. No. 10/849,568.

U.S. Office Action mailed Jan. 9, 2006, from U.S. Appl. No. 10/785,235.

Subramonium et al., "Pulsed PECVD Method for Modulating Hydrogen Content in Hard Mask", U.S. Appl. No. 11/318,269, filed Dec. 23, 2005.

U.S. Office Action mailed Feb. 28, 2006, from U.S. Appl. No. 10/404,693.

U.S. Office Action mailed Mar. 29, 2006, from U.S. Appl. No. 10/800,377.

U.S. Office Action mailed May 31, 2006, from U.S. Appl. No. 10/941,502.

U.S. Office Action mailed May 30, 2006, from U.S. Appl. No. 10/785,235.

U.S. Office Action mailed May 31, 2006, from U.S. Appl. No. 10/849,568.

U.S. Office Action mailed May 2, 2006, from U.S. Appl. No. 11/050,621.

U.S. Office Action mailed Jun. 15, 2006, from U.S. Appl. No. 10/800,409.

Kelman et al., "Method for Reducing Stress in Porous Dielectric Films", U.S. Appl. No. 11/369,311, filed Mar. 6, 2006.

U.S. Office Action mailed Jun. 28, 2006, from U.S. Appl. No. 10/825,888.

U.S. Office Action mailed May 2, 2006, from U.S. Appl. No. 10/295,965.

U.S. Office Action mailed Aug. 9, 2005, from U.S. Appl. No. 10/295,965.

U.S. Office Action mailed Jun. 14, 2006, from U.S. Appl. No. 10/789,103.

U.S. Office Action mailed Sep. 8, 2006, from U.S. Appl. No. 10/404,693.

U.S. Office Action mailed Jul. 12, 2006, from U.S. Appl. No. 10/672,305.

Wu et al., "Methods for Fabricating High Hardness/Modules Low Dielectric Constant Materials," Novellus Systems, Inc., U.S. Appl. No. 11/369,658, filed Mar. 6, 2006, pp. 1-33.

Dhas et al., "Method of Reducing Defects in PECVD TEOS Films," Novellus Systems, Inc., U.S. Appl. No. 11/396,303, filed Mar. 30, 2006, pp. 1-21.

U.S. Office Action mailed Oct. 18, 2006, from U.S. Appl. No. 10/849,568.

Hoek et al., "VLSI Fabrication Processes for Introducing Pores Into Dielectric Materials," Novellus Systems, Inc., Appln No. Not yet assigned, filed Nov. 28, 2006, pp. 1-35.

U.S. Office Action mailed Jan. 24, 2007, from U.S. Appl. No. 10/789,103.

U.S. Office Action mailed Jun. 21, 2007, from U.S. Appl. No. 10/789,103.

U.S. Notice of Allowance and Fee Due mailed Dec. 19, 2006, from U.S. Appl. No. 10/800,409.

U.S. Office Action mailed Apr. 9, 2007, from U.S Appl. No. 10/800,409.

Niu et al., "Methods for Improving the Cracking Resistance of Low-K Dielectric Materials," Novellus Systems, Inc., U.S. Appl. No. 11/376,510, filed Mar. 14, 2006, pp. 1-28.

U.S. Office Action dated May 22, 2007, from U.S. Appl. No. 11/376,510.

U.S. Notice of Allowance and Fee Due mailed Apr. 9, 2007, from U.S. Appl. No. 10/927,777.

Allowed Claims from U.S. Appl. No. 10/927,777.

U.S. Final Office Action mailed Apr. 3, 2007, from U.S Appl. No. 10/941,502.

U.S. Notice of Allowance and Fee Due mailed Dec. 20, 2005, from U.S. Appl. No. 10/860,340.

Allowed Claims from U.S. Appl. No. 10/860,340.

Wu et al., "PECVD Methods for Producing Ultra Low-K Dielectric Films Using UV Treatment," Novellus Systems, Inc., U.S. Appl. No. 11/608,056, filed Dec. 7, 2006, pp. 1-34.

Wu et al., "Methods for Improving Performance of ODC Films with Dielectric Constant < 4.0," Novellus Systems, Inc., U.S. Appl. No. 11/693,661, filed Mar. 29, 2007, pp. 1-46.

U.S. Office Action dated Nov. 28, 2007, from U.S. Appl. No. 10/807,680.

R.J. Lewis, Sr., Hawley's Condensed Chemical Dictionary, 12$^{th}$ Edition, Van Nostrand Reinhold Co., New York, 1993 (no month), excerpts pp. 916-918 & 1123-1124.

Wu et al., "Methods for Producing Low Stress Porous Low-K Dielectric Materials Using Precursors With Organic Functional Groups", U.S. Appl. No. 11/764,750, filed Jun. 18, 2007.

Wu et al., Methods for Producing Low-K CDO Films, U.S. Appl. No. 11/936,754, filed Nov. 7, 2007.

Wu et al., "Methods for Improving Integration Performance of Low Stress CDO Films", U.S. Appl. No. 11/936,752, filed Nov. 7, 2007.

U.S. Notice of Allowance and Fee Due mailed Sep. 27, 2007, from U.S. Appl. No. 11/376,510.

Allowed Claims from U.S. Appl. No. 11/376,510.

U.S. Notice of Allowance and Fee Due mailed Sep. 20, 2007, from U.S. Appl. No. 10/941,502.

Allowed Claims from U.S. Appl. No. 10/941,502.

U.S. Notice of Allowance and Fee Due mailed Feb. 11, 2008, from U.S. Appl. No. 10/789,103.

Allowed Claims from U.S. Appl. No. 10/789,103.

U.S. Office Action mailed Mar. 31, 2008, from U.S. Appl. No. 10/820,525.

U.S. Office Action dated Jul. 10, 2008, from U.S. Appl. No. 10/807,680.

U.S. Office Action mailed Aug. 5, 2008, from U.S. Appl. No. 10/987,208.

U.S. Final Office Action mailed May 29, 2008, from U.S Appl. No. 11/764,750.

U.S. Notice of Allowance and Fee Due mailed Aug. 25, 2008, from U.S. Appl. No. 11/764,750.

Allowed Claims from U.S. Appl. No. 11/764,750.

Solomons and Fryhle, Organic Chemistry, 9$^{th}$ Edition, John Wiley & Sons, Inc., 2008, pp. 602-603.

Wu et al., Methods for Fabricating High Hardness/Modulus Low Dielectric Constant Materials, Novellus Systems, Inc., U.S. Appl. No. 11/369,658, filed Mar. 6, 2006.

Szekeres, A et al., "Plasma-assisted chemical vapor depositing silicon oxynitride as an alternative material for gate dielectric in MOS devices." Microelectronics Journal 37 (2006) pp. 64-70.

U.S. Office Action for U.S. Appl. No. 11/369,658 mailed Dec. 12, 2008.

U.S. Office Action for U.S. Appl. No. 10/987,208 mailed Feb. 4, 2009.

U.S. Office Action for U.S. Appl. No. 11/606,340 mailed Feb. 5, 2009.

U.S. Office Action for U.S. Appl. No. 11/936,754 mailed Jun. 19, 2009.

U.S. Final Office Action for U.S. Appl. No. 10/987,208 mailed Jul. 10, 2009.

U.S. Office Action for U.S. Appl. No. 11/369,658 mailed Jul. 8, 2009.

Wu et al., PECVD Methods for Producing Ultra Low-K Dielectric Films Using UV Treatment, Novellus Systems, Inc., U.S. Appl. No. 11/608,056, filed Dec. 7, 2006.

U.S. Office Action for U.S. Appl. No. 11/608,056 mailed Aug. 20, 2009.

Wu et al., Methods for Improving Performance of ODC Films With Dielectric Consta < 4.0, Novellus Systems, Inc., U.S. Appl. No. 11/693,661, filed Mar. 29, 2007.

U.S. Office Action for U.S. Appl. No. 11/693,661 mailed Aug. 28, 2009.

Wu et al., "Methods for Producing Low Stress Porous Low-K Dielectric Materials Using Precursors With Organic Functional Groups", U.S. Appl. No. 12/348,791, filed Jan. 5, 2009.

Wu et al., "Methods for Producing Low Stress Porous Low-K Dielectric Materials Using Precursors With Organic Functional Groups", U.S. Appl. No. 12/479,114, filed Jun. 5, 2009.

* cited by examiner

METHODS FOR PRODUCING LOW-K CARBON DOPED OXIDE FILMS WITH LOW RESIDUAL STRESS

FIELD OF THE INVENTION

This invention relates to methods for preparing dielectric films having low dielectric constants and high mechanical strength. More specifically, the invention relates to process optimization and improvement through precursor structure selection and process parameter optimization, to lower the tensile stress of carbon doped oxide (CDO) films while maintaining low dielectric constants.

BACKGROUND

There is a general need for materials with low dielectric constants (low-k) in the integrated circuit manufacturing industry. Using low-k materials as the interlayer dielectric of conductive interconnects reduces the delay in signal propagation and signal crosstalk due to capacitive effects. The lower the dielectric constant of the dielectric layer, the lower the capacitance and the lower the RC delay in the lines and signal crosstalk between electrical lines of the IC. Further, the use of low k materials as interlayer dielectric will reduce power consumption of complex integrated circuits.

Low-k dielectrics are conventionally defined as those materials that have a dielectric constant (k) lower than that of silicon dioxide (SiO2), that is k<~4. Generally, they have a dielectric constant of 3 or less. Typical methods of obtaining low-k materials include introducing pores into the dielectric matrix and/or doping silicon dioxide with various hydrocarbons or fluorine. In technology nodes of 90 nanometers and beyond, carbon doped oxide dielectric materials look extremely promising. However, wide spread deployment of these materials in modern integrated circuit fabrication processes presents some technological hurdles.

Specifically, in comparison with silicon dioxide, low-k CDO films typically have inferior mechanical properties due to the presence of ending methyl groups ($-CH_3$), which are incorporated in the film in order to lower the k value of CDO materials. These mechanical properties include hardness, modulus, film residual stress, blanket film cracking threshold or limit, fracture toughness, etc. These properties are dependent primarily on the strength of the atomic bonds and their binding energies. By using conventional Si containing organic molecular precursors in a conventional plasma enhanced chemical vapor deposition (PECVD) process, a dielectric CDO film is obtained that possesses a dielectric constant of 2.7-2.95 with a hardness of 1.2-2.0 GPa, modulus of 6.6 to 12 GPa, and a blanket film cracking limit between 2.3-2.7 µm. Many applications will require cracking thresholds of greater than 3 µm, and more preferably greater than 5 µm. CDO materials of inferior mechanical properties will have adhesive (delamination) and cohesive (cracking) failures during the Cu-low k integration and packaging steps. These failures are exacerbated by the increasing complexity of integrated circuits and manifest with growing numbers of metallization layers. It is not uncommon for a modern IC design to require nine metallization layers, each with a separate dielectric layer. Each of these dielectric layers will have to withstand mechanical stresses from, for example, Chemical Mechanical Polishing (CMP) and/or thermal and mechanical stresses incurred during IC packaging operations.

In addition to modulus, a mechanical property of considerable importance is the residual (or internal) stress of a dielectric film. As explained below, residual stress is comprised of an extrinsic stress component and an intrinsic stress component. Further, internal stress can be either compressive or tensile. Conventional low k films (k<3.2), including CDO films, typically have a tensile stress in excess of 50 MPa. The residual stresses within a deposited dielectric film are of particular interest for this invention. In IC fabrication contexts, these stresses can give rise to various problems such as cracking initiation and propagation and bowing or arching of die. Therefore, low residual stress leads to high cracking resistance, a high cracking or buckling limit and hence a low failure rate during Cu-low k integration and packaging.

FIG. 1a illustrates a dielectric film 105 deposited in a silicon substrate 110, in this case a carbon doped oxide (CDO) film (also known as an organo-silicate glass (OSG) film), where intrinsic tensile stress pulls the film in toward the center of the film and causes it to bend the substrate so that it is concave. A film of excessive tensile stress, such as a conventional CDO film, tends to initiate crack spontaneously or under external influence. Further, the tensile stress tends to propel the crack propagation in the film. FIG. 1b is an illustration of a similar structure in which compressive stress pushes the film out (along the plane of the film) and causes it to bend the substrate so that it is convex. A film of excessive compressive stress tends to lead to film buckling or delamination spontaneously from the substrate. Thus, low residual stress, either tensile or compressive, of CDO film is critical for its application in the Cu-low k integration and packaging.

FIG. 2 is a graph of wafer-level stress as a function of number of process steps for 90 nm CDO technology and 130 nm fluorinated silica glass (SiOF) technology. This figure was taken from Jan, C. H., et al, 90*NM Generation*, 300 *mm Wafer Low k ILD/Cu Interconnect Technology*, 2003 IEEE Interconnect Technology Conference, which is incorporated herein by reference. As shown, each additional layer of CDO dielectric material increases the total tensile residual stress in the test wafer. Clearly, more process steps lead to larger tensile stress in the film. In a typical IC device requiring 5 or more CDO layers, the tensile residual stress creates serious problems. Note that the tensile stress developed in CDO stacks can be partially offset by the compressive stress of an overlying silicon oxide layer (FIG. 2). Even if such silicon oxide layer is used in a fabrication process, it cannot overcome the difficulties associated with significant tensile stress occurring at intermediate stages of the fabrication process.

Many device failures can ultimately be traced to stresses and their variations at various stages of IC processing. Those failures include interfacial delamination between different materials and/or cracking within one layer during chemical mechanical polishing (CMP) and packaging. Excessive stress of thin films, such as CDO films, will also accumulate through multiple layer integration and will result in wafer warping and CMP issues. Since device feature size is continuously shrinking, stress related problems are expected to become more severe. Thus there is a high demand based on the current Cu-low k integration scheme that the stress of CDO films be lowered from the current level (~50 MPa or greater tensile) while raising hardness/modulus and still retaining a low dielectric constant.

SUMMARY

To achieve the foregoing, and in accordance with the purpose of the present invention, methods of improving the mechanical properties of thin films, including CDO films, are disclosed.

In a preferred implementation of the invention a CDO layer is applied to a substrate such the layer has a low dielectric constant (e.g., at most about 3) and low residual stress (e.g., at most about 50 MPa). This is accomplished by introducing a CDO precursor into a deposition chamber that contains a substrate, igniting and maintaining a plasma using dual frequency radio frequency (RF) power having a low frequency (LF) component (e.g., between about 100 kHz and 600 kHz) that corresponds to at least about 2% of the total power (more preferably about 5%). The remainder of the RF power, the high frequency (HF) component, is typically in the range of about 2 MHz and 60 MHz. Additionally, the high frequency component of the RF power may be pulsed at a duty cycle of between about 20-80% during deposition at a frequency of between about 500 Hz and 10 kHz.

In an effort to further reduce residual stress, the substrate may be maintained at between about 300 and 425° C. (or between about 330 and 400° C. in a preferred embodiment) and/or the chamber may be maintained at a pressure of 2-20 Torr (or between 2-9 Torr in a preferred embodiment.)

The resulting CDO dielectric will typically have a dielectric constant of less than about 3.5, with a preferred embodiment having a dielectric constant less than 3 and a modulus of at least about 5 GPa.

The aforementioned precursor may be chosen from a variety of chemical compounds, including silanes, alkylsilanes, alkoxysilanes, linear siloxanes and cyclic siloxanes, and various compounds with silyl groups. Any of these compounds can be used alone or in combination with one or more other precursors. Preferably at least one precursor molecule possesses at least two carbon-silicon bonds per molecule. In variations of the above, at least one precursor may be a siloxane, a silane, or a compound with an organic group that in addition includes a carbon-carbon double bond or triple bond. Such materials can be used alone or in combination with another precursor as either the primary or secondary precursor. In a specific embodiment, the secondary precursor is a relatively small molecule having 2 to 6 carbon atoms and one or more carbon-carbon double bonds or carbon-carbon triple bonds. Specific examples include $C_3H_4$: $CH_3-C\equiv C-H$, $C_2H_2$: $H-C\equiv C-H$, $C_2H_4$: $CH_2CH_2$, and $C_3H_4$: $CH_2=C=CH_2$.

These and other features and advantages of the invention will be presented in more detail below with reference to the associated drawings.

DETAILED DESCRIPTION OF A PREFERRED EMBODIMENT

Introduction and Overview

The present invention relates to methods of creating low-k carbon doped oxide (CDO) layers with high mechanical strength and low residual stress. "Low-k", in the context of this invention means that the dielectric constant of the CDO layer is not greater than about 3.5 and preferably not greater than about 3.

The residual stress of CDO films produced under unoptimized process conditions is generally >50 MPa with a typical value in the range between 60 MPa and 90 MPa. The processes of this invention significantly lower residual film stress by appropriate precursor selection and/or optimizing deposition process conditions.

As indicated above, the residual stress in a thin film can arise from two different sources: intrinsic and extrinsic. Extrinsic stress is produced from a source external to the film. In integrated circuits, extrinsic stress is typically caused by the mismatch in thermo-mechanical properties between a dielectric layer and the underlying substrate, especially a mismatch in their thermal expansion coefficients. Lowering the deposition temperature will minimize the extrinsic stress in a film, as will a smaller mismatch in coefficients of thermal expansion between the film and the substrate.

Intrinsic stress can be traced to the film-growth mechanism and the final lattice structure of the dielectric material. It depends upon the deposition conditions, such as deposition temperature, the frequency and power of a radio frequency (RF) source used to generate a plasma, deposition pressure, deposition rate, chemical precursor(s) and the carrier gas used.

In some embodiments of the invention, the CDO films include at least some carbon-carbon double bonds and/or some carbon-carbon triple bonds. Understand the processes of this invention are not limited to CDO films including unsaturated groups of CDO films formed from precursors having unsaturated groups.

As discussed later, the incorporation of carbon-carbon triple bond in the CDO film can be detected using Fourier Transformation Infrared (FTIR) spectrometry. The content of carbon-carbon triple bond in the CDO film can be quantitatively described by the ratio of its FTIR peak area centered at $\sim 2100$ cm$^{-1}$ (assignable to $C\equiv C$ stretching) to the FTIR peak area of main backbone Si—O—Si matrix centered at $\sim 1020$ cm$^{-1}$. Ideally, the ratio of FTIR $C\equiv C$ triple bond peak to Si—O bonds will fall in the range of about 0.05% to 20%, more preferably in the range of about 0.3% to 7%.

Figure 1A:
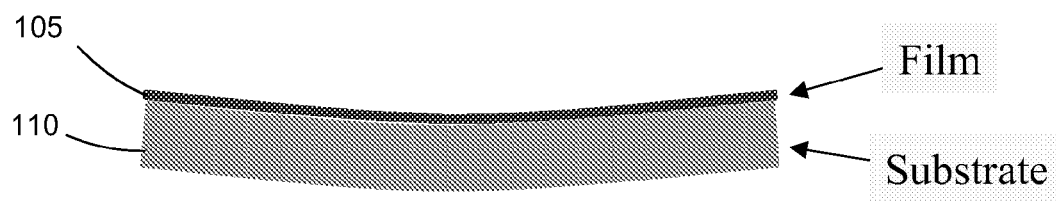
FIG. 1a illustrates a dielectric film under tensile stress.
Figure 1B:
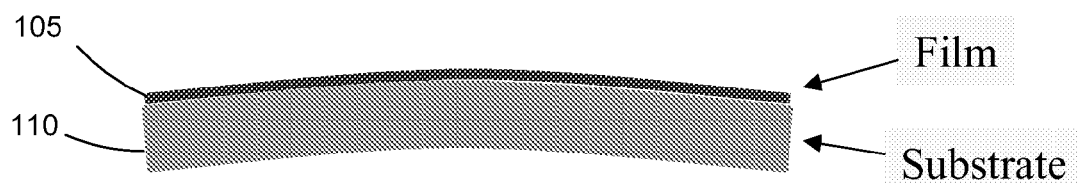
FIG. 1b illustrates a dielectric film under compressive stress.
Figure 2:
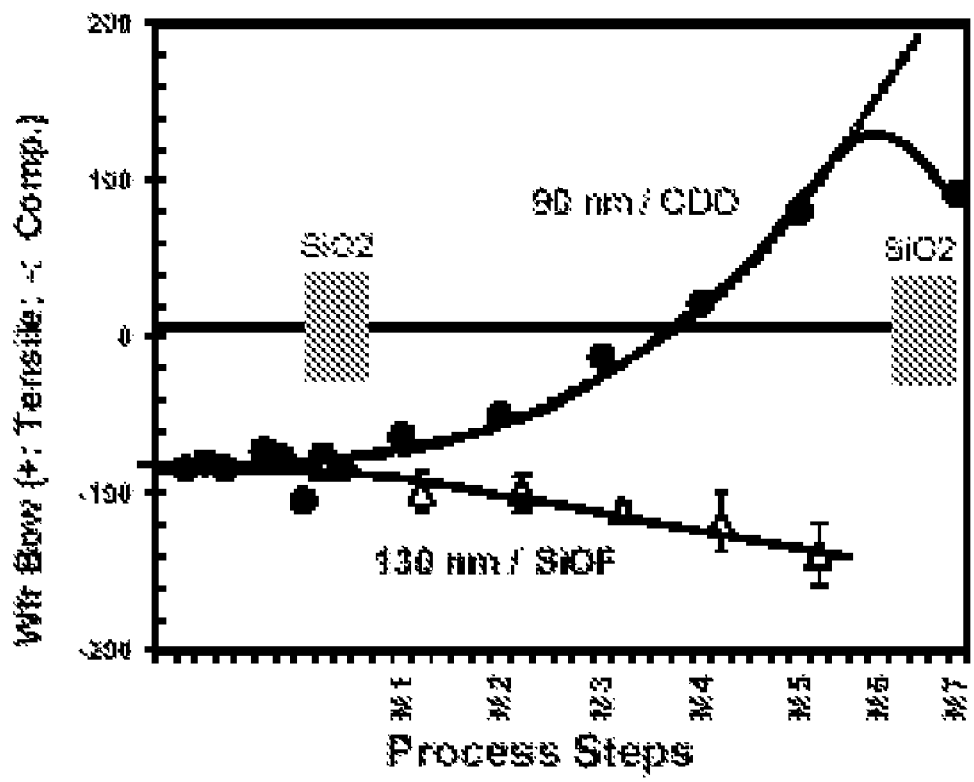
FIG. 2 is a graph of wafer-level stress as a function of process steps for 90 nm technology and 130 nm SiOF technology.
Figure 3:
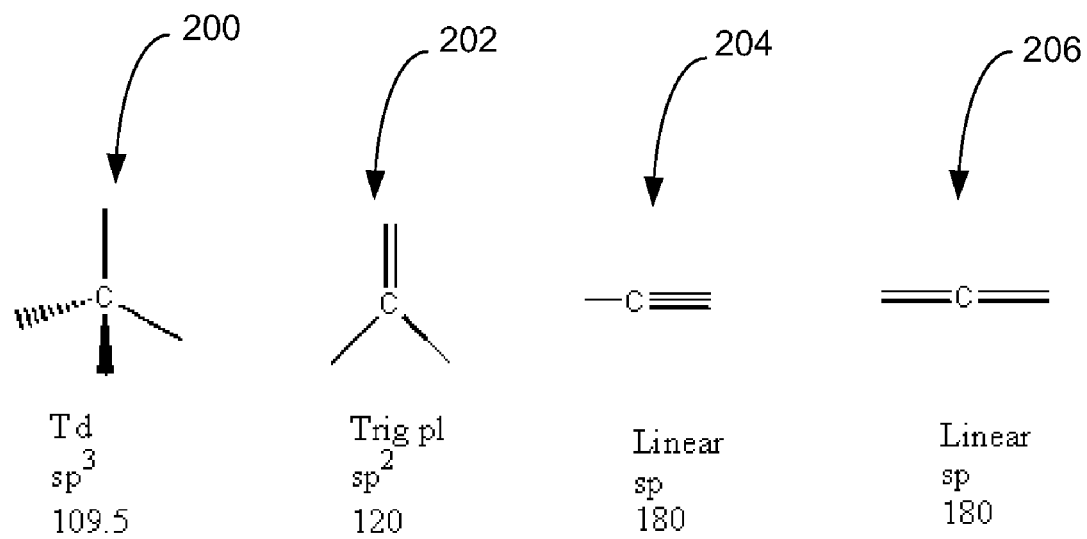
FIG. 3 is a diagram of four major structural configurations for carbon in CDO films.

The advantages gained by introducing these unsaturated groups can be understood as follows. There are four major structural configurations for carbon in CDO films. By way of illustration, FIG. 3 illustrates these configurations. The $sp^3$ structure 200 has the most degrees of freedom while the other three formats ($sp^2$ format 202 and sp formats 204 and 206) have fewer degrees of freedom and thus have more rigidity. Due to the reactive nature of deposition process and carbon-carbon triple bonds, not only triple bonds themselves but also their derivative forms will be present in CDO films. These derivative forms result from the opening of one or two of the triple bonds to form carbon-carbon double bonds or carbon-carbon bond, and/or cross-linking to Si—O—Si network. The $sp^2$ and sp structures comprise C=C or C≡C bonds, respectively and have significantly different atom-atom of distance than do C—C, C—O, Si—O, or Si—C bonds. The nominal bond length of a C—C bond is ~1.5 Å, that of a C=C bond is ~1.3 Å and that of C≡C bond is ~1.2 Å. The bond length of a C—O bond is ~1.1 Å while the nominal bond length of a Si—O bond is ~1.6 Å and that of a Si—C bond is ~1.9 Å. Because of their rigidity and shorter bond lengths, the C=C or C≡C bonds and their derivative forms provide a means to alter the Si—O—Si matrix structure and to engineer the lattice structure of CDO films in such a way that it minimizes the lattice mismatch between the CDO film and the substrate and thus lowers the tensile stress commonly associated with the CDO film. In one embodiment, the invention pertains to any modified Si—O—Si backbone structure that possesses an average bond angle of less than approximately 145 degrees, and has a stretching vibration peak at a wave number of less than 1100 $cm^{-1}$ on FTIR spectrum.

Another aspect of the invention provides deposition conditions selected to introduce increased desired bond incorporation and cross-linking/bridging within the dielectric network, e.g., by employing a dual frequency RF plasma source having a significant content of low frequency power and employing precursors that provide additional carbon content and carbon containing bonding structures. The deposition conditions are selected to enhance the incorporation of desired bonds in precursor(s) into CDO film and the cross-linking of those bonds during deposition. The desired bonds incorporated in films and their derivatives after cross linking with other compositional atoms, e.g., Si, O, C, and/or H, in the CDO film include acetylene (Si—C≡C—Si), ethylene (Si—CH=CH—Si), ethane (Si—$CH_2$—$CH_2$—Si), methylene (Si—$CH_2$—Si), Si—CH=C(O)—Si, —CHIC)—C(O,C)—, —CH=CH—C—, —CH=CH—O—, etc. The open space introduced in the lattice by these bonds in CDO films helps lowering the dielectric constant (e.g., to a value of less than about 3). Of course, incorporation of carbon in the films also lowers the dielectric constant.

The total residual stress of the CDO films produced using these methods (precursor and/or process optimization) should preferably have less than about 50 MPa of tensile stress, and more preferably less than about 35 MPa tensile stress, and even more preferably less than about 30 MPa tensile stress. It is possible that the resulting film may have a compressive stress rather then a tensile stress (which is usually shown as a negative number). If the film exhibits a net intrinsic compressive stress, the magnitude of that compressive stress should be less than about 50 MPa, and more preferably a magnitude of less than 35 MPa compressive, and even more preferably a magnitude of less than about 20 MPa compressive. One suitable apparatus used to measure internal stress is the "Flexus" tool purchased from KLA-Tencor Corporation. But any tool that accurately measures bow or other deviation from planarity in a wafer can be employed.

While the primary focus of this invention is reducing residual stress in CDO films, the films preferably possess a variety of other improved mechanical properties rendering them suitable for integration in demanding IC fabrication processes. Examples of such other mechanical properties include hardness, modulus, blanket film cracking limit, fracture toughness (resistance to crack propagation after a crack is initiated) and cracking propagation velocity. Hardness and modulus are well defined within the art and will not be discussed in detail herein. Measures of film modulus presented herein may be made with any suitable apparatus including a nano-indenter device. In the context of the present invention, a desirable modulus range is higher than about 3 GPa, most preferably higher than about 6 GPa.

One manifestation of residual tensile stress in a film is cracking. A film's cracking threshold is a measure of the thickness of the film on a blank substrate (e.g., a flat 200 mm wafer) that can be deposited without forming a crack. In a typical experiment, the dielectric film is deposited to various thicknesses using a single set of process conditions. The resulting wafer (with dielectric layer) is set aside without disturbance for a period of time (e.g., one day) and examined for cracks by using a microscope. The greatest thickness at which no crack is observed is defined as the cracking threshold. For many processes, the cracking threshold is measured in μm. For the purposes of this invention, the cracking threshold is greater than about 3 μm. Most preferably, the cracking threshold is greater than about 5 μm.

Another physical property of relevance to the CDO film is its refractive index. This value has a bearing on the etch sensitivity of the resulting film due to the fact that the refractive index is a measure of film density and carbon content. For many applications, it is desired that the film be relatively easy to etch, i.e the film has high etch selectivity to underlying layer and photoresist, relatively high etch rate, uniform etch and stability in the etching ambient. In this regard, the refractive index should be at most about 1.6. More preferably, it ranges between about 1.3 and 1.6. Refractive index can be measured by many types of conventional optical inspection tools such as ellipsometers and reflectometers.

Note that the CDO films described in this application are composed of, at least, silicon, oxygen, hydrogen, and carbon. The typical chemical composition of the as deposited CDO films includes 10-50 atomic percentage silicon, 5-60 atomic percentage oxygen, 5-50 atomic percentage carbon and 20-35 atomic percentage of hydrogen. In some embodiments, other elements may be present in the CDO films. These elements include fluorine (F), germanium (Ge), etc.

Figure 4:
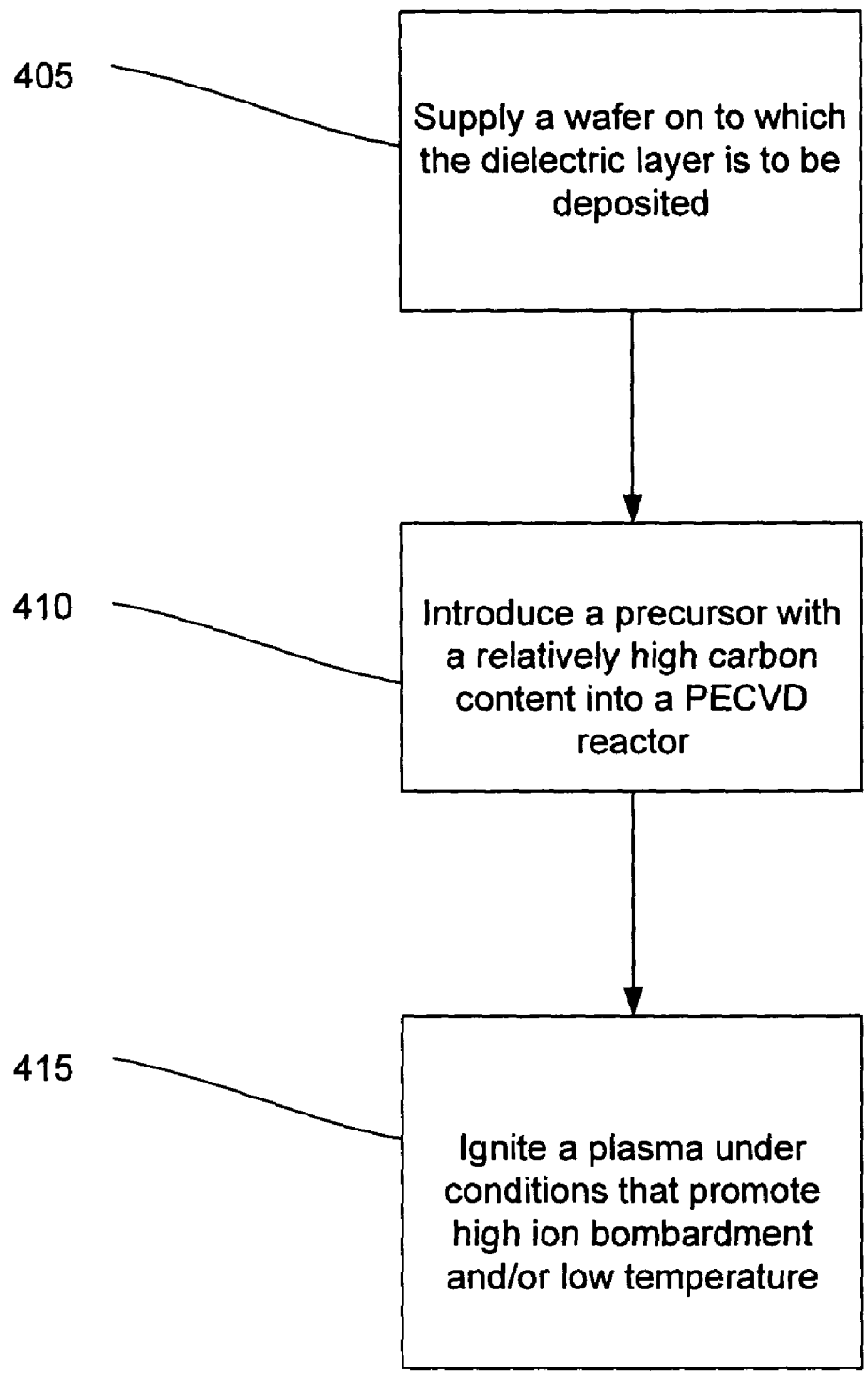
FIG. 4 is a flowchart illustrating the basic method for creating low-k CDO dielectric layers with low residual stress and high hardness/modulus.

FIG. 4 is a flowchart illustrating at a high level one methodology for creating low-k CDO dielectric layers with low residual stress and preferably high hardness/modulus. In a step 405 a wafer is supplied. In step 410, one or more precursors are introduced. Precursors are chosen to have a high carbon content and, in some embodiments, one or more double bonds or triple bonds. In step 415, plasma is ignited under conditions that promote high ion bombardment and/or low temperature. Selection of precursors employed in step 410 is detailed in the Precursor Optimization section below. Step 415 is described in detail in the Process Optimization section, also furnished below.

Precursor Optimization

As indicated, both process optimization and precursor selection can have strong effects on the material properties of the film. Precursors of interest should be carbon rich and, in some embodiments, contain some degree of saturation (e.g., at least one carbon-carbon triple bond or double bond). Carbon may be provided in the form of alkyl groups, alkene groups (containing at least one carbon-carbon double bond), and alkyne groups (containing at least one carbon-carbon triple bond). For many applications, it will be desirable to choose at least one precursor that has at least one carbon-carbon triple bond. Further, it may be useful to employ precursors having at least two carbon-silicon bonds per molecule. Precursors having any of these enumerated properties may be used alone (in a process gas having a single precursor) or in combination with other precursors.

Examples of precursors for CDO dielectrics include silane (in combination with a carbon containing precursor), alkylsilanes (e.g., trimethylsilane, and tetramethylsilane), alkoxysilanes (e.g., methyltriethoxysilane (MTEOS), methyltrimethoxysilane (MTMOS) diethoxymethylsilane (DEMS), methyldimethoxysilane (MDMOS), trimethylmethoxysilane (TMMOS) and dimethyldimethoxysilane (DMDMOS)), linear siloxanes (e.g., diethoxymethylsilane), cyclic siloxanes (e.g. alkylcyclotetrasiloxanes such as octamethylcyclotetrasiloxane (OMCTS) and tetramethylcyclotetrasiloxane (TMCTS)), and various compounds with silyl groups. In each class of compounds, the precursor may be entirely unsaturated or it may include one or more carbon-carbon triple bonds or double bonds.

Because the CDO film may include carbon-carbon triple bonds or double bonds (or derivative forms of these), a precursor may include these bonds as well. Precursors having carbon-carbon triple bonds or double bonds may be found in various classes of compound including, for example, silanes having at least one hydrocarbon group with a carbon-carbon double bond and at least one alkyl group or at least one oxy-hydrocarbon group, silanes having at least one hydrocarbon group with a carbon-carbon triple bond and at least one alkyl group or at least one oxy-hydrocarbon group, bis(alkylsilyl)acetylenes, bis(alkylsilyl)ethylenes, and siloxanes having pendant hydrocarbon groups with a carbon-carbon triple bond or double bond. Several silicon-containing hydrocarbons (with or without oxygen) have been identified as potential precursors that may be used in a deposition process to form CDO films of low stress having low dielectric constants. These include the following:

Ethynyltrimethylsilane ($SiC_5H_{10}$): ETMS, also known as trimethylsilaneacetylene (TMSA), $(CH_3)_3Si—C≡C—H$
Propargyltrimethylsilane ($SiC_6H_{12}$): PTMS, $(CH_3)_3Si—CH_2—C≡C—H$
Propargyloxytrimethylsilane ($SiC_6H_{12}O$): POTMS, $(CH_3)_3Si—O—CH_2—C≡C—H$
Bis(trimethylsilyl)acetylene ($Si_2C_8H_{18}$): BTMSA, $(CH_3)_3Si—C≡C—Si(CH_3)_3$
1,3-Diethynyltetramethyldisiloxane ($Si_2C_8H_{14}O$): DTDS, $HC≡C—Si(CH_3)_2—O—Si(CH_3)_2—C≡C—H$
1,3-Divinyltetramethyldisiloxane ($Si_2C_8H_{18}O$): DVDS, $H_2C=CH—Si(CH_3)_2—O—Si(CH_3)_2—CH=CH_2$
Vinyltrimethylsilane ($SiC_5H_{12}$): VTMS, $(CH_3)_3Si—CH=CH_2$
Vinylmethyldimethoxysilane ($SiC_5H_{12}O_2$): VMDMOS, $(CH_3O)_2(CH_3)Si—CH=CH_2$
Dimethylmethoxysilaneacetylene ($SiC_5H_{11}O$): DMMOSA, $(CH_3O)(CH_3)_2Si—C≡CH$
Methyldimethoxysilaneacetylene ($SiC_5H_{11}O_2$): MDMOSA, $(CH_3O)_2(CH_3)Si—C≡CH$
Dimethylethoxysilaneacetylene ($SiC_6H_{13}O$): DMEOSA, $(C_2H_5O)(CH_3)_2Si—C≡CH$
Methyldiethoxysilaneacetylene ($SiC_7H_{15}O_2$): MDEOSA, $(C_2H_5O)_2(CH_3)Si—C≡CH$
Ethyldiethoxysilaneacetylene ($SiC_8H_{17}O_2$): EDEOSA, $(C_2H_5O)_2(C_2H_5)Si—C≡CH$
Dimethylsilane-diacetylene ($SiC_6H_8$): DMSDA, $(CH_3)_2Si(C≡CH)_2$
Methylsilane-triacetylene ($SiC_7H_6$): MSTA, $(CH_3)Si(C≡CH)_3$
Tetraacetylene Silane ($SiC_8H_4$): TAS, $Si(C≡CH)_4$
Divinyldimethylsilane ($SiC_6H_{12}$): DVDMS, $(CH_3)_2Si(CH=CH_2)_2$ The functional groups are C=C (double bonds) and C≡C (triple bonds) which may be pendant or embedded within other functionalities. Preferably, the desired functional group in the precursor(s) is the C≡C (triple bonds). During deposition, these special functional groups become integrated in the CDO film on the substrate. Rigid C=C and/or C≡C bonds, and their derivative bonding structures through cross-linking with Si, O, and C, when embedded in the CDO film, strengthen the material matrix and alter Si—O—Si backbone structure of CDO films, resulting in a more rigid lattice, thus lowering the tensile stress of the CDO film. As presented below, the incorporation of C=C and C≡C bond and their derivative forms within the Si—O—Si structure was observed by FTIR and other analytical methods.

As mentioned, such films may be formed from a single carbon-containing precursor or multiple precursors in combination. Obviously, if a single precursor is used, then it must contain at least one carbon-carbon triple or double bond, and more preferably at least one carbon-carbon triple bond. But if multiple precursors are used in combination, it is not necessary for each of them to include an unsaturated group. Various primary precursors may be employed which have no double bonds or triple bonds.

In some embodiments employing multiple precursors, a secondary precursor is introduced for the sole purpose of providing double bonded or triple bonded hydrocarbon molecules. Many of these are relatively small molecules having 2 to 6 carbon atoms and one or more carbon-carbon double bonds or carbon-carbon triple bonds. Specific examples include $C_3H_4$: $CH_3—C≡C—H$, $C_2H_2$: $H—C≡C—H$, $C_2H_4$: $CH_2=CH_2$, $C_3H_6$: $CH_2=CH—CH_3$, $C_3H_4$: $CH_2=C=CH_2$, and cyclopropene ($C_3H_4$). Other potential candidates for secondary precursors are silicon-containing hydrocarbons, or oxygen-containing hydrocarbons.

The precursor, in liquid or gaseous form, is one component of the process materials employed during deposition. The process chemicals are those gases or liquids introduced into a reactor, such as a chemical vapor deposition (CVD) reactor, to allow deposition of the CDO film. Generally, the process gases will include at least a carrier gas and one or more precursor gases/liquids introduced to the reaction chamber via the carrier gas. At least one of the precursors or the carrier gas should act as a source of oxygen. The source of silicon usually comes from a precursor gas/liquid. The hydrocarbon groups for the CDO film (including groups containing carbon-carbon double bonds and triple bonds) may come from either the precursor chemical(s) or the carrier gas, as indicated.

Generally, the carrier gas is provided in much greater volumes than the precursor chemical(s). It is used as a delivery vehicle and a means for sweeping precursor materials and byproducts through the reactor. Various oxygen containing gases such as molecular oxygen ($O_2$), ozone ($O_3$), carbon dioxide ($CO_2$), carbon monoxide (CO), nitrous oxide ($N_2O$), etc. may be used. Carbon dioxide is preferred for many applications of this invention. In some embodiments hydrogen is used as the carrier gas. In still other embodiments, inert gases such as helium, argon, etc. are used. Examples of hydrocarbon carrier gases include acetylene ($C_2H_2$), ethylene ($C_2H_4$), propene ($CH_2$=$CHCH_3$), propyne ($CH_3C$≡$CH$), 1,2-propadiene ($CH_2$=$C$=$CH_2$), and cyclopropene ($C_3H_4$).

In one example, the process gas employs a carrier gas but no separate oxygen source. Examples of the carrier gas include inert gases and hydrogen. In this example, a single precursor provides all the necessary oxygen, silicon, and carbon, including the carbon-carbon triple bonds and/or double bonds. As indicated, siloxanes and various silanes or compounds having silyl groups with hydrocarbon oxy moieties are suitable for this purpose.

In a second process gas example, the carrier gas again provides no oxygen. In this case, however, there are at least two precursor gases. The primary precursor provides oxygen, silicon, and some amount of carbon and hydrogen. Examples of such primary precursors include TMCTS, DEMS, MTEOS and OMCTS. A secondary precursor is employed to provide the carbon-carbon triple bonds and/or double bonds. Note that in some cases, the carrier gas could be one of the secondary precursor hydrocarbons.

In a third process gas example, the carrier gas supplies some or all of the oxygen. As indicated, examples of suitable oxygenated carrier gases are carbon dioxide, ozone, molecular oxygen or other oxygen containing molecules. In this third example, only a single precursor is employed. It may or may not include oxygen. In cases where no oxygen is used, it could simply be a hydrocarbon silane material. Preferably, however it includes some degree of saturation. More preferably, the saturation involves one carbon-carbon triple bond. Examples of suitable precursors for this embodiment include ETMS or TMSA, PTMS, BTMSA, TAS, MSTA, MDEOSA, DMEOSA, DMSDA and VTMS. Any one of these "single precursors" may be used in conjunction with a carrier gas.

In a fourth example of a process gas, oxygen is again supplied in a carrier gas such as carbon dioxide, oxygen, ozone, or nitrous oxide. However, in this case two or more precursors are employed. At least one of these may be similar to those identified in the second example. However, it is not necessary for oxygen to be present in either the primary or secondary precursors. However, in some embodiments, some amount of oxygen may be present in one or more of these molecules. Many relatively simple hydrocarbon silanes and/or silyl compounds may be employed as the primary precursor.

Some specific examples of process gases include the following.
1. one precursor (C—C triple bond but not oxygen containing)
   a. TMSA+$CO_2$
   b. TMSA+$CO_2$+$O_2$
   c. TMSA+He+$CO_2$
   d. TMSA+He+$O_2$
   e. TMSA+$N_2O$
   f. TMSA+$H_2$+$CO_2$
   g. TMSA+He+$H_2O_2$
   h. BTMSA+$CO_2$+$O_2$
2. one precursor (C—C triple bond AND oxygen containing)
   a. MDEOSA+He
   b. MDEOSA+$CO_2$
   e. MDEOSA+He+$O_2$
3. Two or more precursors (C—C triple bond AND Oxygen containing in either one)
   a. TMSA+TMCTS+He
   b. TMSA+TMCTS+$CO_2$
   c. TMSA+TMCTS+He+$O_2$
   d. TMSA+OMCTS+$CO_2$
   e. TMSA+OMCTS+He+$O_2$
   f. TMSA+DEMS+OMCTS+He+$CO_2$+$O_2$
4. One precursor (not oxygen containing, C—C triple bond from carrier gas)
   a. 2MS (dimethylsilane)+$C_2H_2$+$CO_2$
   b. 2MS+$C_2H_2$+$N_2O$
   c. 3MS (trimethylsilane)+$C_2H_2$+He+$O_2$
   d. 4MS (tetramethylsilane)+$C_2H_2$+$CO_2$+$O_2$
5. one precursor (oxygen containing, C—C triple bonds from carrier gases)
   a. TMCTS+$C_2H_2$
   b. TMCTS+$C_2H_2$+He
   c. TMCTS+$C_2H_2$+$CO_2$
   d. TMCTS+$C_2H_2$+He+$CO_2$+$O_2$
   e. OMCTS+$C_2H_2$+He
   f. OMCTS+$C_2H_2$+He+$O_2$
   g. OMCTS+$C_2H_2$+He+$CO_2$
6. No carbon-containing precursor (carrier gas contains carbon and C—C triple bond)
   a. $SiH_4$+$C_2H_2$+$CO_2$
   b. $SiH_4$+$C_2H_2$+He+$CO_2$
   c. $SiH_4$+$C_2H_2O$+He Understand that this invention is not limited to deposition processes employing precursors with carbon-carbon double bonds or triple bonds. Nor is it limited to dielectric films including such groups.

Process Optimization

Various deposition techniques may be employed to form the CDO dielectric materials of this invention. These include various other forms of chemical vapor deposition (CVD) including plasma enhanced CVD (PECVD) and high-density plasma CVD (HDP CVD). HDP CVD of dielectric materials is described in various sources including U.S. patent application Ser. No. 09/996,619, filed Nov. 28, 2001 by Atiye Bayman et al. and titled "Gap Fill for High Aspect Ratio Structures", which is incorporated herein by reference for all purposes. Additionally, other techniques such as spin selected techniques and deposition from supercritical solutions may be employed. But for many applications of this invention, a plasma based CVD process is employed.

The process deposition conditions may be optimized to reduce either the intrinsic or extrinsic stress (or both) of a CDO film. Conditions that reduce intrinsic stress generally enhance/promote the incorporation of desired bonding structures in the as deposited CDO films.

Further, the deposition conditions may be optimized to promote the cross-linking of incorporated bonds, e.g. to enhance/promote the cross-linking of methyl groups incorporated in the film to form Si—$CH_2$—Si structure. Without this cross-linking, the film mechanical strength will generally be low due to the fact that an increase in content of methyl group $CH_3$ as a terminating group in the CDO film will reduce the bonding density per volume and thus the bonding integrity of the film. With cross-linking, Si—$CH_2$—Si bonds are formed to strengthen the existing Si—O—Si cage structure. As a result, the mechanical strength, or the toughness, of the as deposited film will be high.

One method to reduce extrinsic stress in the CDO film is to employ a relatively low deposition temperature. The coefficients of thermal expansion for the underlying substrate and the CDO film(s) are generally mismatched. Therefore, CDO films deposited at high temperatures will exhibit relatively high extrinsic stresses at ambient temperatures. Therefore, in order to achieve a reduction of the film's stress due to temperature effects, during deposition the substrate should be maintained at a temperature of between about 300 and 425°

Figure 5:
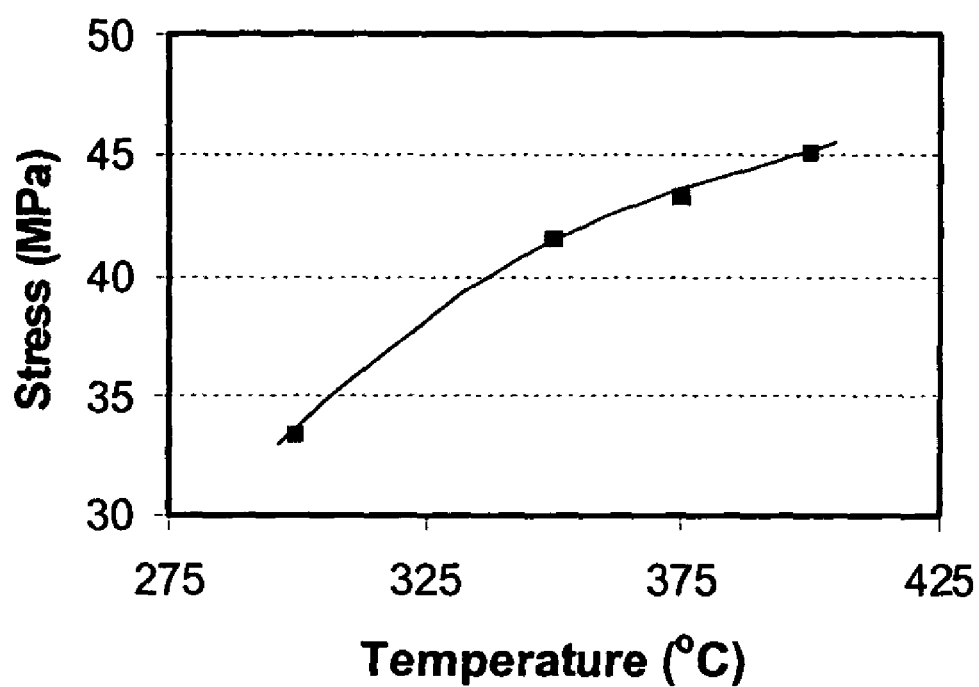
FIG. 5 is a graph of film stress vs. deposition temperature.

C., and preferably between about 300 and 350° C. FIG. 5 illustrates how the film stress varies with the deposition temperature using OMCTS as chemical precursor and $CO_2$ as the carrier gas. Near k=3.0, the 400° C. process yielded a stress around 45 MPa. As deposition temperature decreases, the film stress decreases rapidly. At a deposition temperature of 300° C., the film stress is around 33 MPa, significantly lower than the stress at 400° C. The film deposited at 300° C. had a k value of 2.87.

As indicated, intrinsic stress can be reduced by promoting cross-linking (alkylene bridging) in the CDO film. One method of accomplishing this is by increasing ion bombardment during the PECVD deposition. Process conditions that increase ion bombardment may be chosen to increase one or both of (a) the mean energy of ion striking the substrate and (b) the flux of ions reaching the substrate. Physically, these results may be achieved by selecting process conditions that accomplish one of the following: (i) increasing the mean free path of the ions in the plasma, (ii) reducing the distance that an ion must travel before striking the substrate, and (iii) increasing the mean energy or momentum of the ions that strike the substrate surface.

To increase the momentum or energy of ions striking the substrate surface, at least two different process conditions may be manipulated. First, using a dual-frequency reactor of the type described below, one can increase the relative amount of the low frequency component of the RF energy supplied to the reactor. This has the effect of increasing the length of time in a given oscillation during which ions are accelerated in a single direction (toward the wafer surface). Because the ions are exposed to a field in this direction for a longer period of time (biased), they can accelerate to higher speeds and hence strike the substrate with greater momentum. Second, one can pulse the high frequency component of the RF power to accomplish a similar result.

As is well known in the art, in general, high frequency components of the RF power delivered to a reactor control the plasma density and low frequency components produce ion bombardment of the film. The high and low frequency components can be provided at any of a number of suitable frequencies. In a typical process, the Low Frequency LF component is provided in a frequency range of about 100 to 600 kHz, more preferably about 200-500 kHz, for example about 300 kHz. The High Frequency HF component is generally between 2-60 MHz—in one process example, an HF frequency of 13.156 MHz is used.

In one embodiment, the low frequency component of delivered RF power is between about 2 and 90 percent of the total power, and more preferably between about 5 and 60 percent of the total power. The optimal value will vary depending upon the mean free path of the ions and the various conditions that impact mean free path. In a specific example, the total power delivered is about 800 Watts for a reactor processing six 200 mm wafers (e.g., about 0.4 $W/cm^2$). This value can be varied depending upon the specific application and plasma reactor employed. In many cases, the low frequency component has a power of between about 0.02 and 20 $Watts/cm^2$, more preferably between about 0.05 and 0.4 $W/cm^2$. This preferred range might vary depending upon the CVD chamber design. With some CVD chamber designs, the preferred range may shift to a higher range, e.g., 4 $W/cm^2$ to 15 $W/cm^2$.

In addition to varying the ratio of HFRF to LFRF, the HFRF power may be pulsed at a certain duty cycle, for example pulsing at between 500 Hz and 10 kHz and varying the HFRF duty cycle from 20-80%. This effectively superimposes a low frequency component on the plasma generation power.

Figure 6:
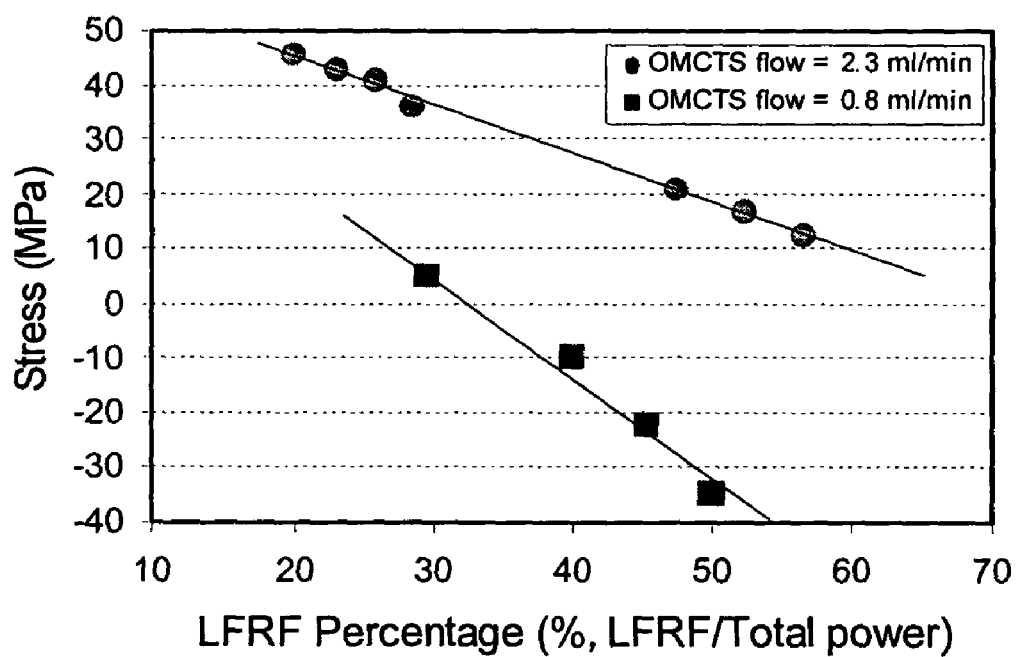
FIG. 6 is a graph of film stress vs. LFRF power percentage.

As shown in FIG. 6, the film stress decreases linearly as LFRF power percentage in total RF power increases. A negative stress i.e. compressive stress can be achieved at a high percentage of LFRF power. The deposition was performed on Novellus Sequel® platform using OMCTS as a precursor and $CO_2$ as a carrier gas in all cases. The OMCTS flow rate was 2.3 ml/min in for data points shown as circles and 0.8 ml/min for the data points shown as squares. It is noted that the precursor flow rate also impacts the film residual stress.

Figure 7A:
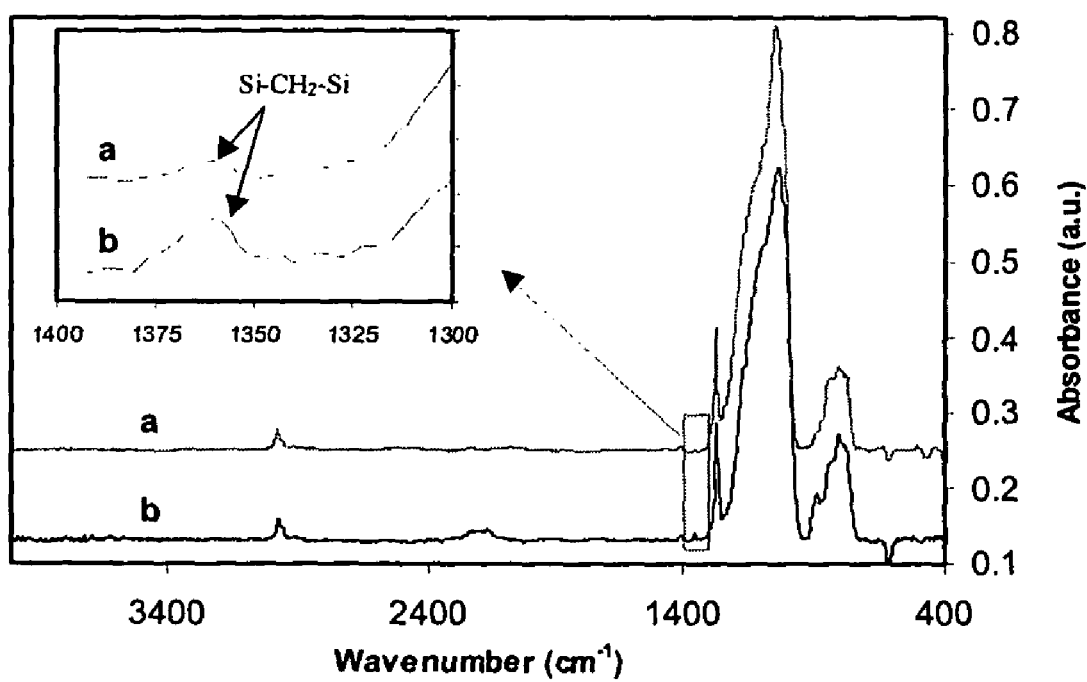
FIG. 7A is a graph showing FTIR spectra of films prepared according to one aspect of the present application.

FIG. 7A presents FTIR spectra of CDO films produced under identical conditions, except that the film was produced using a greater percentage of the LFRF component. The LFRF power for Film a is 0% while it is 25% for Film b.

The formation of Si—$CH_2$—Si is evident when viewing the FTIR spectra of the deposited films. FIG. 7A shows that film "b", the film with the higher refractive index has a bigger peak assigned to the bending of C—H in Si—$CH_2$—Si cross-links (see peak at approximately 1360 $cm^{-1}$ in the inset). However, the k values of both films "a" and "b" are the same (k=2.94 and hardness ~=2.02 GPa.) The formation of Si—$CH_2$—Si bonding structures is also evident by the refractive index of the as-deposited film. Table 1 below summarizes the properties of Film "a" and Film "b". Although the k value and hardness are similar for these two films, the difference in film bonding structure, especially in the Si—$CH_2$—Si bond as shown in FIG. 7A, has affected in a way that the two films have significantly different refractive index (R1) and in-film stresses. Film "b", which has a higher refractive index, has a lower tensile stress than film "a". The additional bonding in film "b" also improved its cracking limit over film "a".

TABLE 1

|  | K | H (GPa) | RI | Stress (MPa) | Cracking Limit (um) |
|---|---|---|---|---|---|
| Film "a" | 2.94 | 2.02 | 1.3913 | 88.5 | 1.5 μm |
| Film "b" | 2.94 | 2.06 | 1.4404 | 67.9 | 4.3 μm |

With lower tensile stress or with compressive stress, the mechanical properties of CDO films improve significantly. It is clear that the critical cracking thickness of CDO film of k>2.60 has increased by significantly from 1.5-4 μm to 3->10 μm.

Figure 7B:
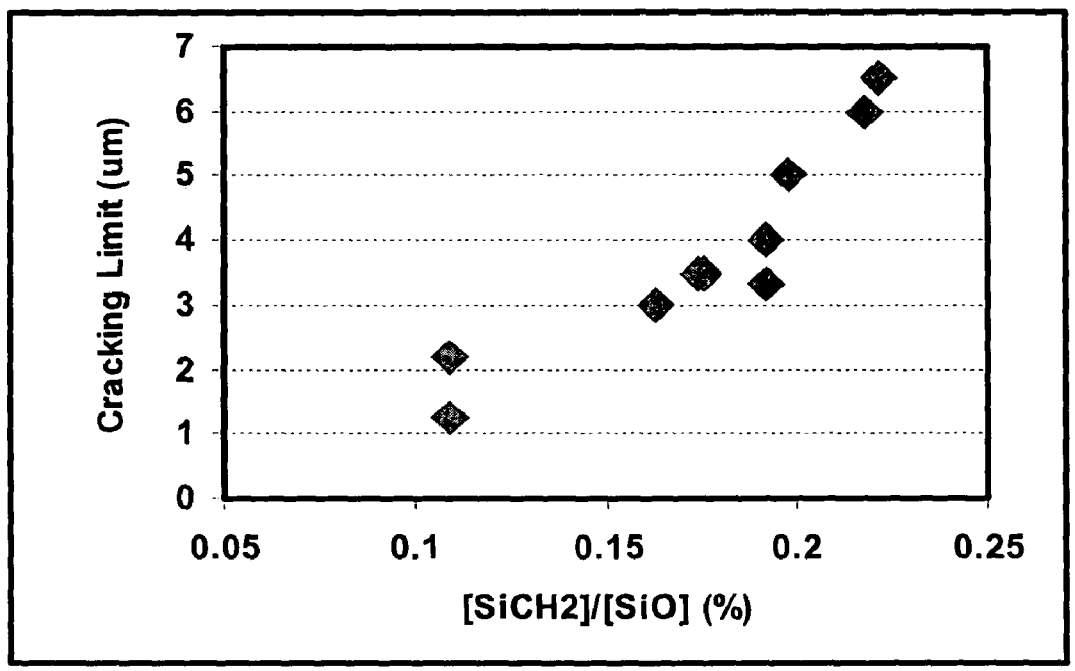
FIG. 7B is a plot of cracking limit for various CDO films as a function of the methylene bridging group content in the film.

FIG. 7B shows cracking limit of various CDO films plotted as a function of FTIR peak area ratio for [Si—$CH_2$—Si]/[Si—O]. As shown, the cracking limit exhibits a strong dependence on the relative amount of Si—$CH_2$—Si present. In this example, the CDO films were prepared in Novellus Sequel® PECVD tool using TMCTS as a precursor and CO2 as a carrier gas. The only difference in process conditions for depositing the various films was in varying LFRF power, precursor flow rate and total RF power.

Another method that may be used to increase ion bombardment during film deposition is to alter the deposition pressure. This simply increases the mean free path of ions in the deposition chamber. In one embodiment of the invention the deposition pressure is maintained at a pressure of between about 2 to 20 Torr, more preferably in the range of about 2-10 Torr (e.g., about 2 to 6 Torr).

Still another adjustment that may be used involves varying showerhead gap, defined as the distance between the showerhead and the heater block on which the substrate is placed. This reduces the distance that an ion must travel before striking the substrate. The ideal gap depends on the type of reactor employed and the process conditions. For many situations, the gap is preferably between about 5 and 100 millimeters.

Process optimization also includes setting the proper flow rates of the various compounds in the process gases. Note that the flow rates are chosen depending upon the amount of surface area to be covered. One can certainly scale the flow rates chosen depending upon variations in the area to be deposited, including in situations where the reactor employs fewer or greater number of wafers and possibly employs 300 millimeter wafers as opposed to 200 millimeter wafers. For example, in experiments where six 200 millimeter wafers were used, the total precursor flow rate was 0.5 sccm to about 10 sccm. Note that this comprises the total flow rate of all precursors.

Figure 7C:
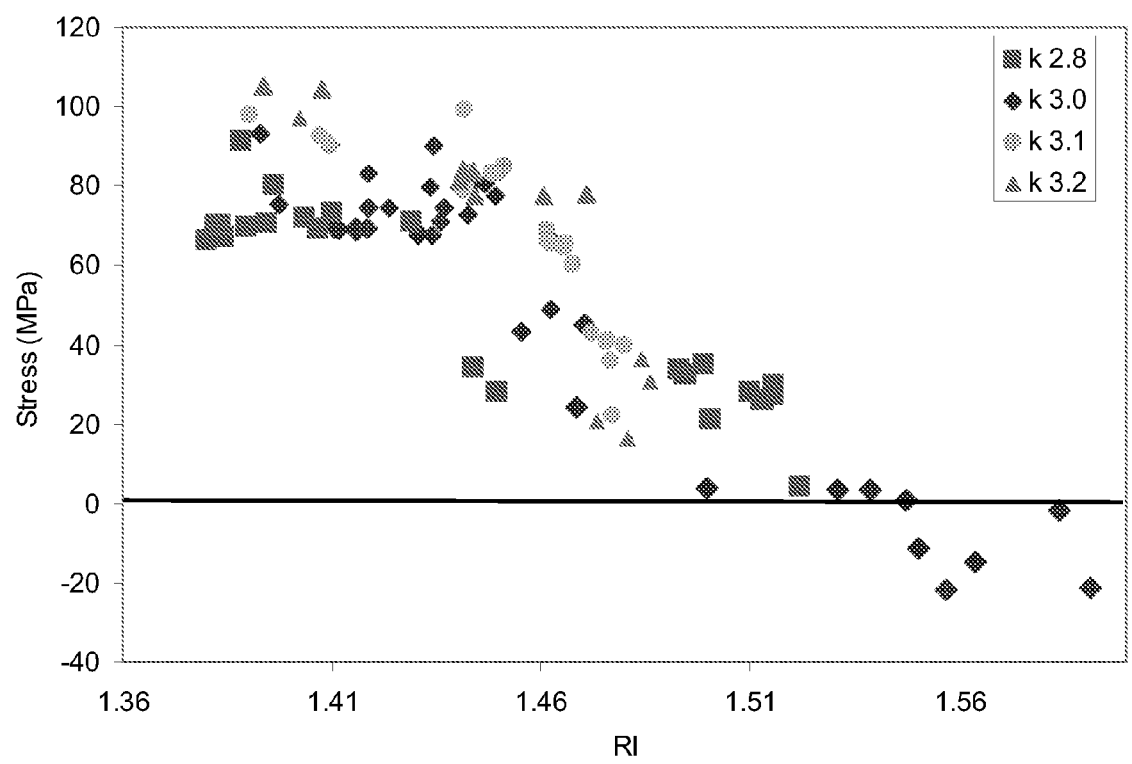
FIG. 7C is a plot showing tensile stress versus refractive index (a measure of the methylene bridging group content) for CDO films of 4 different dielectric constants.

FIG. 7C shows additional data illustrating the relationship between film stress and refractive index in "as deposited" CDO films. Refractive index (RI) is a measure of the film density and C content. An increase in RI is associated with an increase in the Si—C bond content. As a major cross-linking type, methylene bridging (Si—$CH_2$—Si) in the film is a preferred form. As shown, the tensile stress decreases below 50 MPa as the content of carbon and methylene bridging increases (manifest as increasing values of refractive index). In this figure, stress values were plotted for CDO films of different dielectric constant values (k=2.8, 3.0, 3.1, and 3.2). Those films were deposited using different precursors disclosed here and deposition conditions were adjusted to target different dielectric constant. The deposition conditions varied here include deposition temperature, precursor flow rates, carrier gas types (oxygen containing or inert types), HFRF and LFRF total power and ratio, and deposition pressure.

With a low tensile stress or a compressive stress, the mechanical properties of CDO films improve significantly as indicated by experimental examples presented below. It is noted that the blanket film cracking limit has improved significantly for all k values below 3.0. The cracking limit of CDO films having a dielectric constant k=2.60 was improved from 1.5 μm to 3 μm. The cracking limit of CDO films having a dielectric constant k=2.70 was improved from ~2.2 μm to 5 μm. The cracking limit of CDO films having a dielectric constant k=2.90 was improved from 2.5 μm to >10 μm. Combined with an unaltered modulus, the CDO films of low stress demonstrated a remarkable improvement in film cracking resistance, thus providing a more robust dielectric film for Cu/low k integration and packaging.

EXPERIMENTAL

Various additional experiments were conducted to confirm aspects of this invention. Some of these are presented below.

Figure 8A:
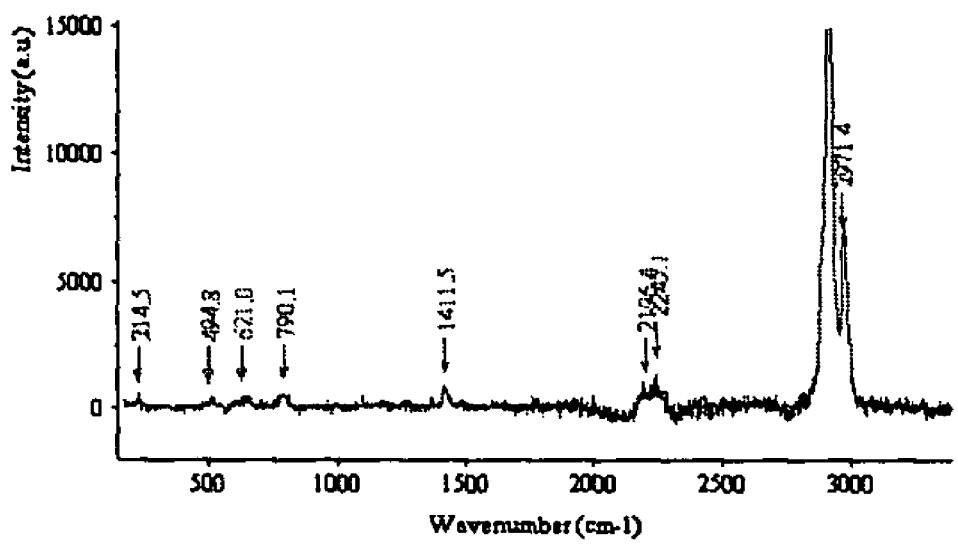
FIGS. 8a and 8b are graphs showing Raman spectra comparing a film prepared from TMCTS and a film prepared from BTMSA, respectively.
Figure 8B:
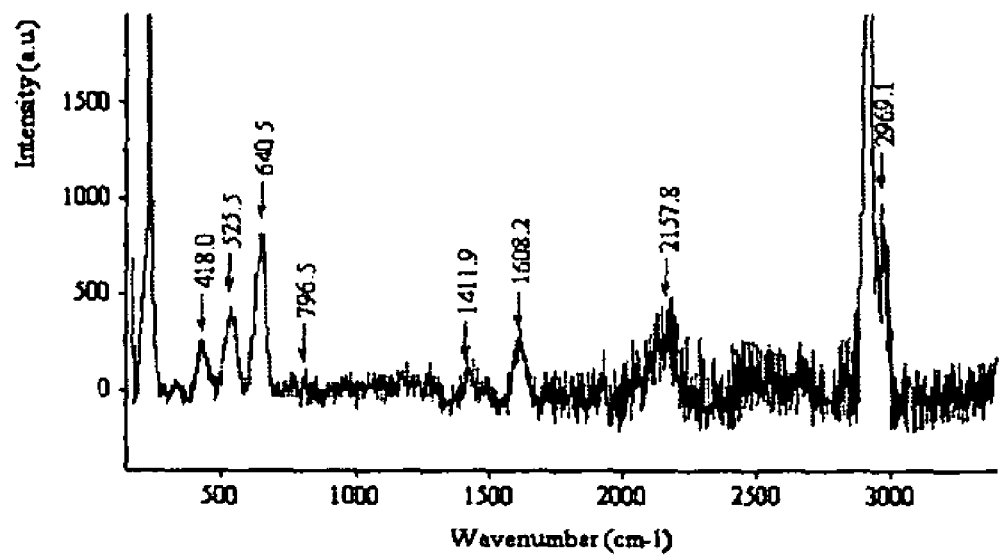

Raman analyses of CDO films have been done. FIG. 8a is a TMCTS-based film and FIG. 8b is a BTMSA-based film. As explained, TMCTS is a cyclic tetrasiloxane without any double or triple bond and BTMSA is a bis(silyl)acetylene. The two films are characterized by strong sharp peaks at 2910 & 2970 $cm^{-1}$, typical for symmetric and asymmetric stretching of $CH_3$ groups in —Si—$CH_3$ structure, typical for silicones. The band at ~1418 $cm^{-1}$ in both spectra may be related with scissoring of —$CH_3$ groups. FIG. 8a (the TMCTS-based film) has a peak at 790 $cm^{-1}$ that is due to Si—C stretching similar to the same band in SiC (a transversal optical (TO) band) and silicones. This peak was weak in FIG. 8b (the BTMSA-based film), at 796 $cm^{-1}$. A peak at 2100~2245 $cm^{-1}$ in FIG. 8a is likely due to Si—H stretching. FIG. 8b has a band at 1608 $cm^{-1}$ due to —C=C— stretching, which was not detected in the TMCTS-based film. A peak in FIG. 8b at ~2250 $cm^{-1}$ is probably due to —C≡C— originating in the BTMSA precursor. These results show that there are —C=C— and —C≡C— bonds in the BTMSA-based film, which is consistent with the FTIR results. It is believed that the —C=C— and —C≡C— bonds play a key role in lowering the residual stress of the CDO film. In FIG. 8a, bands at 494 & 621 $cm^{-1}$ are due to —Si—O—Si— vibrations. They probably are shifted in FIG. 8b (LS Coral) at 525 & 640 $cm^{-1}$, although the assignment of these bands is not certain.

Figure 9:
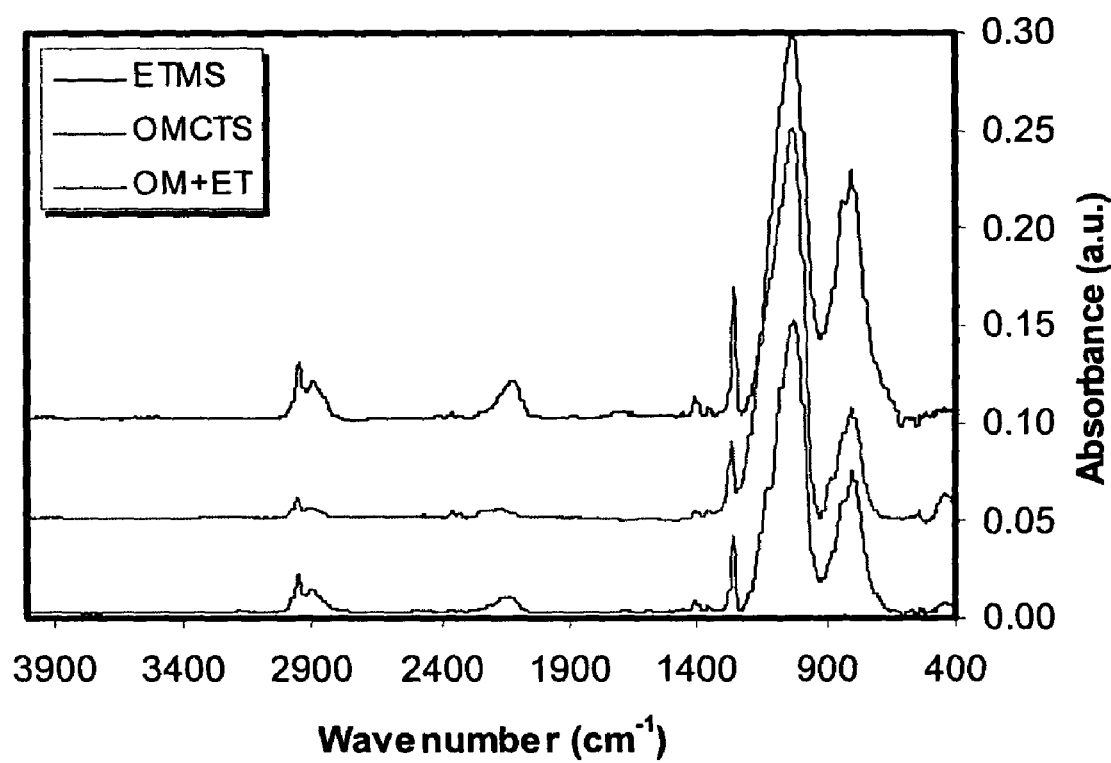
FIG. 9 shows FTIR spectra of ETMS, OMCTS and OMCTS+ETMS films.

FIG. 9 shows FTIR spectra of ETMS, OMCTS and OMCTS+ETMS films, illustrating the chemical structure of the CDO matrix. The FTIR spectra of three CDO films exhibit an absorption peak corresponding to C—H stretch around 2900 to 3000 $cm^{-1}$. For $CH_3$, the symmetric and asymmetric stretches are expected at 2964-2967 and 2907-2909 $cm^{-1}$, respectively.

For methylene groups ($CH_2$), 2933 and 2878 $cm^{-1}$ are assigned as the symmetric and asymmetric stretches, respectively. $CH_3$ symmetric and $CH_2$ asymmetric stretches were observed for all three films at 2955 and 2878 $cm^{-1}$, respectively. The —C≡C— stretching band for the ETMS and OMCTS+ETMS films was observed at 2115 and 2120 $cm^{-1}$, respectively, which suggests that a significant amount of carbon triple bonds were incorporated into the CDO matrix after plasma polymerization. There is no stretching band for OMCTS film but it contains two Si—H stretching bands, which are $(SiO)_3Si$—H and $(CH_3)(SiO)_2Si$—H, observed at 2214 $cm^{-1}$ and 2150 $cm^{-1}$, although they are very weak. The middle peaks around 1250-1280 $cm^{-1}$ in the FTIR spectra of all three films in FIG. 9 are assigned as the Si—$(CH_3)_x$ methyl rocking bands at 1270 $cm^{-1}$ for OMCTS film and 1260 $cm^{-1}$ for ETMS and OMCTS+ETMS films. The Si—O stretching bands for all three films were observed at 1022 $cm^{-1}$. The FTIR spectra of all three films also show SiC stretching bands at 796, 873, and 821 $cm^{-1}$.

Figure 10:
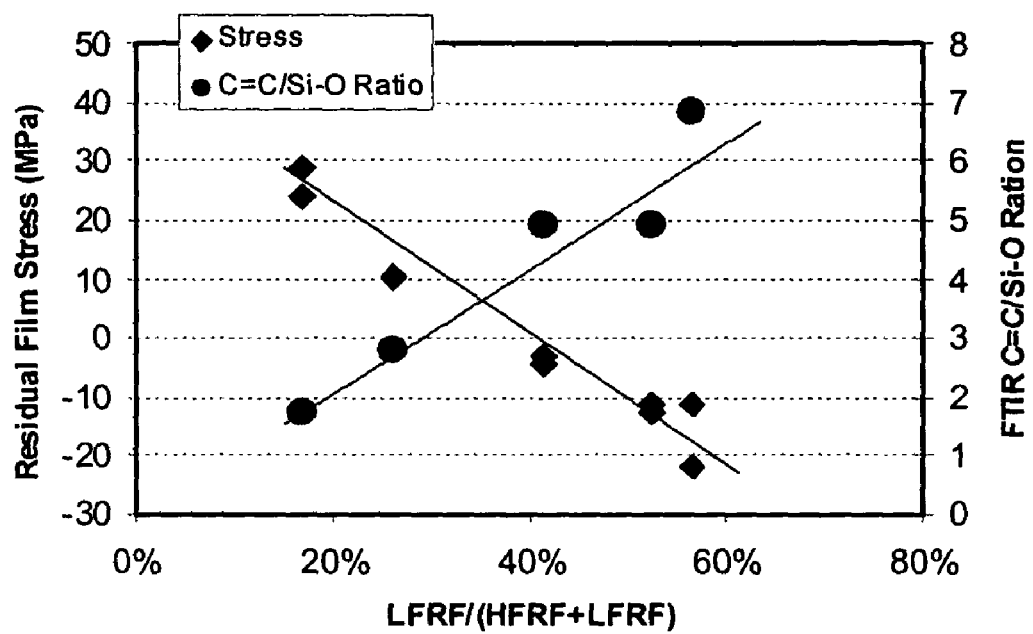
FIG. 10 is a graph showing film residual stress vs. LFRF power.

Using low frequency RF power, the concentration of desired bonds (i.e. —C=C— or —C≡C—, and their derivatives) in the CDO film deposited can be modulated. FIG. 10 shows that film residual stress decreases with increasing LFRF power. It is also noted that the increase of the —C≡C— concentration within the film correlates well with the increases of LF power.

Figure 11:
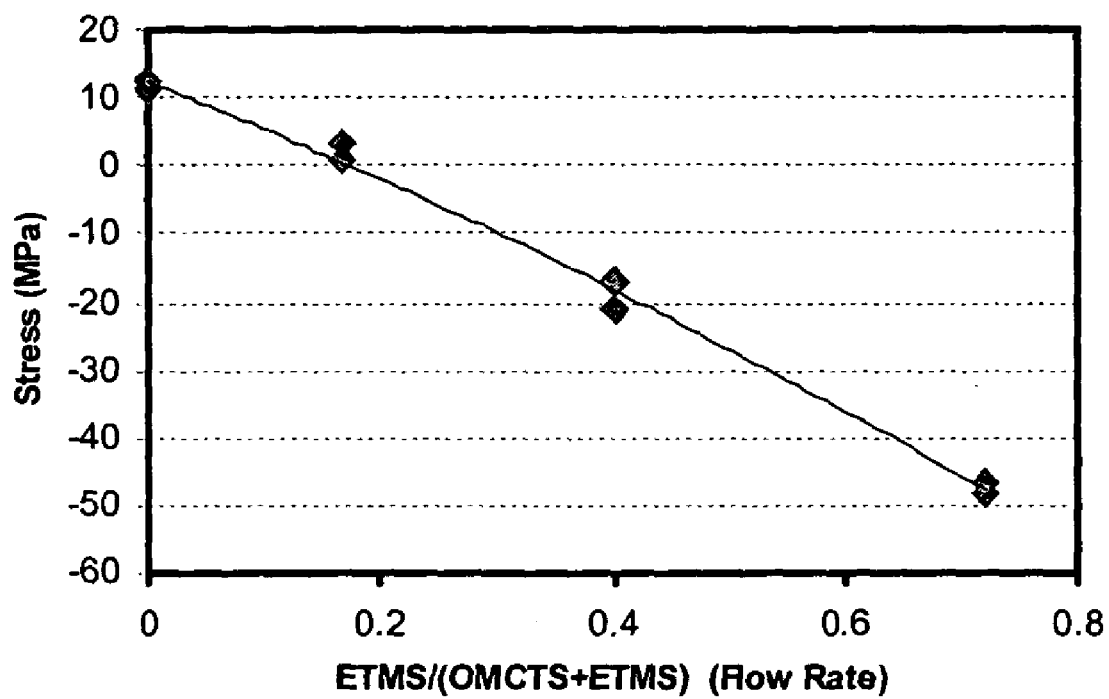
FIG. 11 is a plot of stress decreasing with increasing flow rate of a precursor with novel functional groups.

As expected, the relative concentration of unsaturated precursor in the total precursor supplied to a reactor directly affects the —C≡C— concentration in CDO film and thus the film residual stress. As shown in FIG. 11, stress decreases with increasing concentration of the ETMS precursor with the novel functional groups (triple bonds) relative to concentration of unsaturated OMCTS. As explained, the group with structure of —C≡C— can enlarge ring structure in the CDO network to create more free space thus reducing k value while extending the lattice constant of the building block (Si—O—Si backbone structure) of the CDO film to reduce the residual stress of the film.

Figure 12:
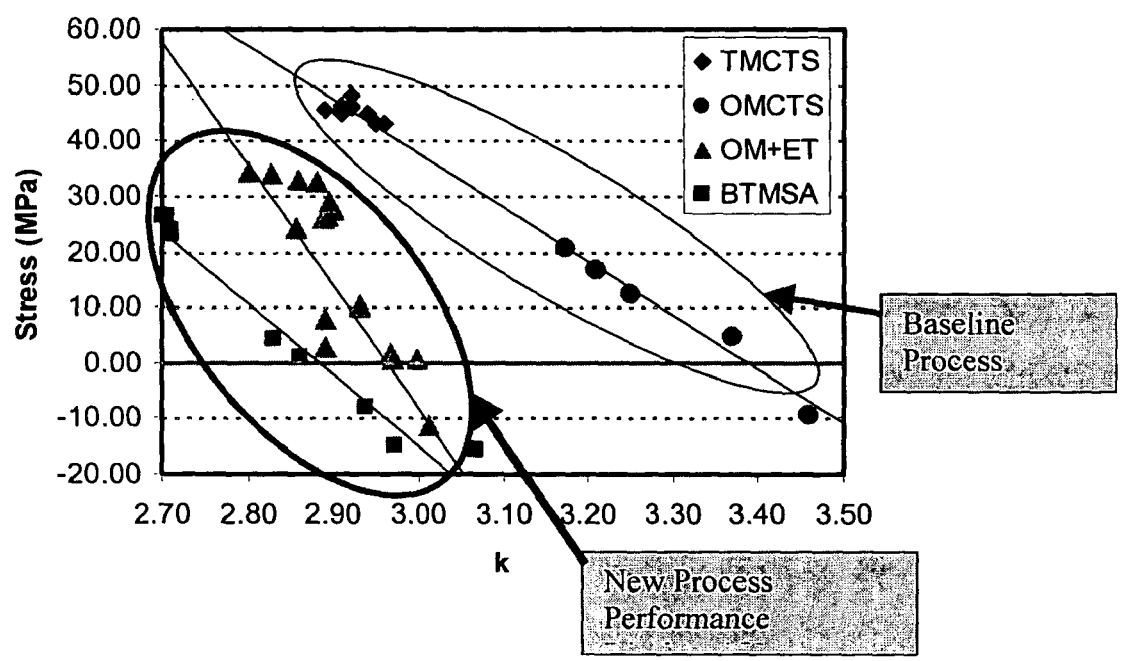
FIG. 12 plots residual film stress as a function of k value for films deposited using different precursors.

To illustrate the stress reduction with the disclosed functional groups (C=C and/or C≡C bonds), FIG. 12 plots residual film stress as a function of k value for films deposited using different precursors. Note that preferred CDO materials (produced in accordance with this invention) tend to reside on the lower left hand side of the plot. Specifically, it can be seen that films with C=C and/or C≡C bonds deposited using OMCTS+ETMS (OM+ET) have significantly lower stress than films without C=C and/or C≡C bonds deposited using OMCTS or TMCTS. For example, at k value of 3.0, the stress for OM+ET is around −11 MPa (compressive) while the stress for films deposited with OMCTS or TMCTS alone is >40 MPa (tensile). With optimal precursor structure and process conditions, the residual stress of CDO films can be significantly lowered for k ~3.0 from the current level (~50 MPa tensile) to well below 30 Mpa (tensile), and as low as −20 MPa (compressive). In this set of experiments the k value of the deposited film was as low as 2.60.

FIG. 12 also shows that the CDO film deposited with another preferred precursor BTMSA with C≡C bond results in even lower stress than ETMS for a fixed k value. A low tensile stress of 26 MPa was obtained for k=2.7 CDO film. It can be seen that the residual film stress has been reduced significantly in comparison with those films without C=C (double bond) and/or C≡C (triple bond).

Various additional examples will now be presented. These show the effects of increasing LFRF and of providing precursors with carbon-carbon double bonds and triple bonds.

Example 1

In this example, the RF power was set at 600 W and 400 W for HF RF and LF RF power, respectively, on a Sequel® chamber (Novellus Systems, Inc, San Jose, Calif.), which can be used to deposit films on six 200 mm wafers simultaneously. A chamber pressure of 4 Torr was used in this process. The gas mixture of liquid BTMSA flow rate of 2 ml/min and $CO_2$ flow rate of 3000 sccm was used during CVD polymerization at 350° C. The as-deposited film had a dielectric constant of 2.95 and stress of −21.4 Mpa (compressive). The cracking limit of as deposited film was tested to be larger than 10 μm.

Example 2

Figure 13:
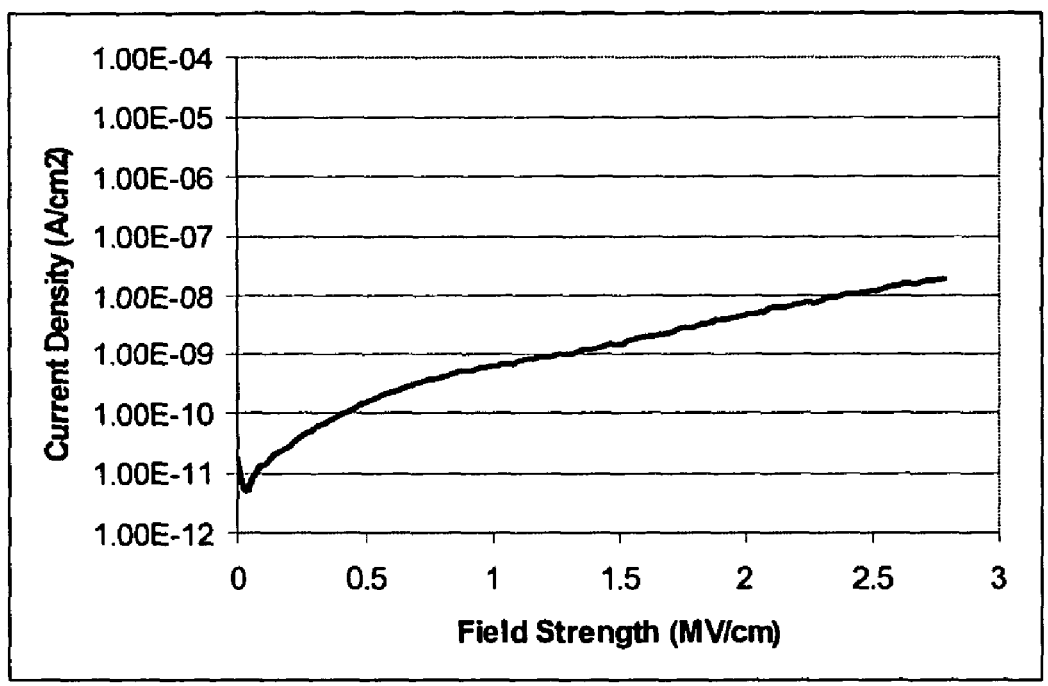
FIG. 13 is a plot of the electrical performance of the film described in experimental example 2.

In this example, the RF power was set at 1000 W and 300 W for HF RF and LF RF, respectively, in a Sequel® chamber (Novellus Systems, Inc., San Jose, Calif.). A chamber pressure of 7 Torr was used in this process. The gas mixture of liquid BTMSA flow rate of 2 ml/min and $CO_2$ flow rate of 3000 sccm was used during CVD polymerization at 350° C. The as-deposited film had a dielectric constant of 2.71 and a low tensile stress of 23.8 MPa. The critical cracking thickness of this film is >4.8 μm. The electrical performance of this film was also tested using metal-insulator-semiconductor (MIS) structure. The IV curve was plotted in FIG. 13—current density versus field strength (IV) curve, which was measured using MIS structure. Excellent electrical performance was shown with current density <0.7 $nA/cm^2$ at a field of 1 MV/cm.

Example 3

In this example, the RF power was set at 1000 W and 1300 W for HF RF and LF RF power, respectively, in a Sequel® chamber. A chamber pressure of 4 Torr was used in this process. The gas mixture of liquid OMCTS flow rate of 1.6 ml/min, liquid ETMS flow rate of 0.4 ml/min and $CO_2$ flow rate of 3000 sccm was used during CVD polymerization at 350° C. The as-deposited film had a dielectric constant of 3.01 and low stress of −11.2 Mpa (compressive). The film has a modulus of >11 GPa and a critical cracking thickness of >10 μm.

Example 4

In this example, the RF power was set at 1000 W and 350 W for HF RF and LF RF power, respectively, in a Sequel® Chamber. A chamber pressure of 4 Torr was used in this process. The gas mixture of liquid OMCTS flow rate of 2 ml/min, ETMS flow rate of 0.3 ml/min and $CO_2$ flow rate of 3000 sccm was used during CVD polymerization at 350° C. The as-deposited film had a dielectric constant of 2.86 and a low tensile stress of 23.2 MPa. The film has a hardness of 1.63 GPa, a modulus of >10 GPa and a critical cracking thickness of >10 μm. In comparison, the films deposited without C=C or C≡C bonds perform relatively poorly. For example, a conventional CDO film deposited using only TMCTS and $CO_2$ with k value of 2.85 has a hardness of 1.45 GPa, modulus of 9.0 GPa and a cracking limit of 2.4 μm, all of which are significantly lower than those for the film disclosed here.

Example 5

In this example, the RF power was set at 1200 W and 300 W for HF RF and LF RF power, respectively, in a Sequel® chamber. A chamber pressure of 7 Torr was used in this process. The gas mixture of liquid BTMSA flow rate of 2.0 ml/min and $CO_2$ flow rate of 3000 sccm was used during PECVD deposition at 350° C. The as-deposited film had a dielectric constant of 2.69 and a low tensile stress of 24 MPa. The critical cracking thickness of this film is >5 μm.

Example 6

In this example, the HF RF power was set at 1000 W and no LF RF power was used in a Sequel® chamber. A chamber pressure of 7 Torr was used in this process. The gas mixture of liquid ETMS flow rate of 1.5 ml/min and $CO_2$ flow rate of 4000 sccm was used during PECVD deposition at 400° C. The as-deposited film had a dielectric constant of 2.61 and stress of 35.6 MPa (tensile). The critical cracking thickness of this film is 3 μm.

Example 7

In this example, the HF RF power was set at 3000 W and LF RF power at 200 W in a Novellus "Vector®" chamber, which can deposit films on four 300 mm wafers simultaneously. A chamber pressure of 5.5 Torr was used in this process. The gas mixture of liquid TMSA flow rate of 2.5 ml/min, $CO_2$ flow rate of 4000 sccm and $O_2$ flow rate of 200 sccm was used during PECVD deposition at 400° C. The as-deposited film had a dielectric constant of 2.71 and stress of 43 Mpa (tensile). The critical cracking thickness of this film is >5 μm.

Example 8

In this example, the HF RF power was set at 1900 W and LF RF power at 300 W in a Novellus "Vector®" chamber. A chamber pressure of 5.0 Torr was used in this process. The gas mixture of liquid TMSA flow rate of 2.5 ml/min and $CO_2$ flow rate of 5000 sccm was used during PECVD deposition at 400° C. The as-deposited film had a dielectric constant of 2.86 and stress of 17.6 Mpa (tensile). The modulus of the film is 9.75 GPa and the critical cracking thickness of this film is >5 μm.

Example 9

Figure 14:
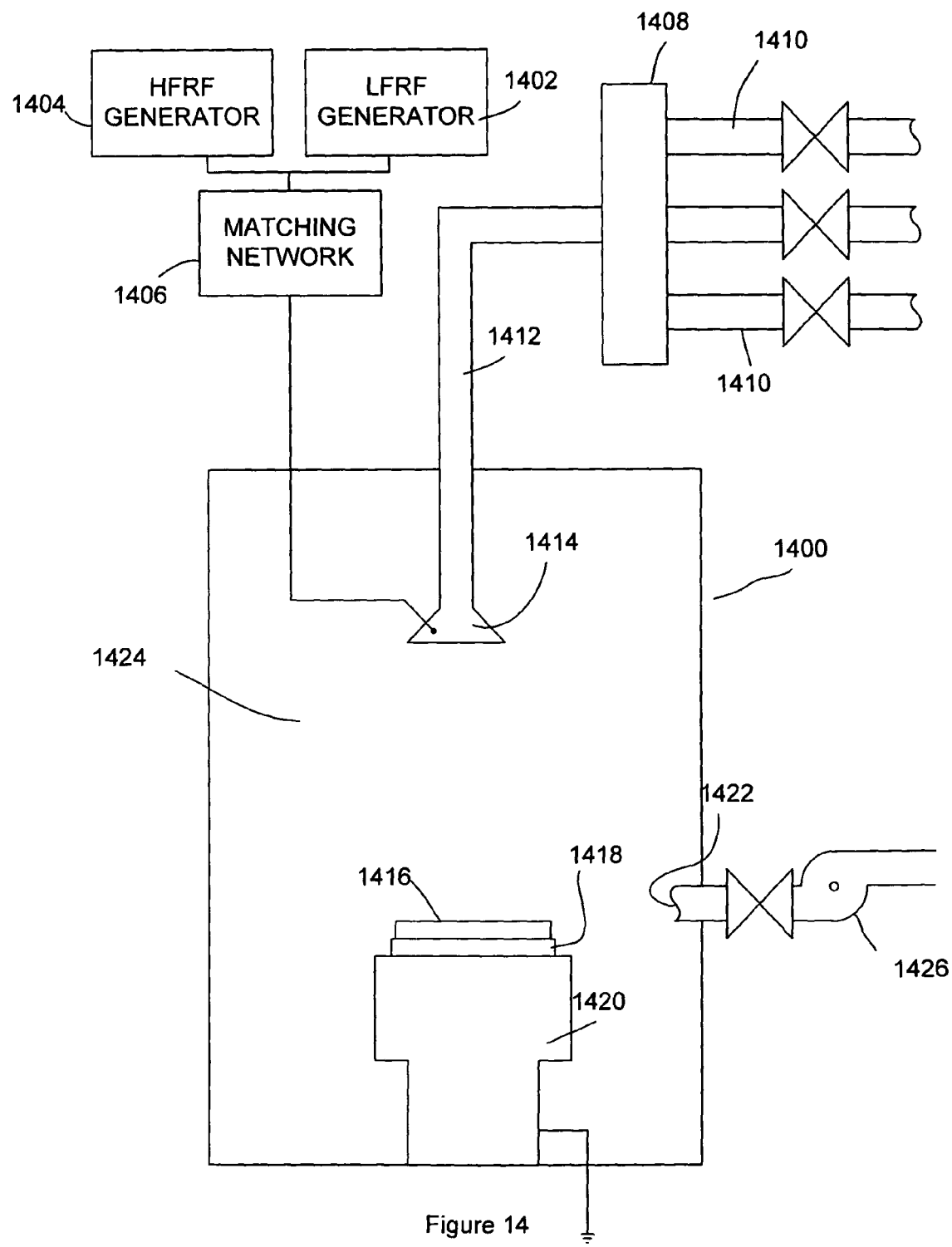
FIG. 14 provides a simple block diagram depicting various reactor components arranged as in a conventional reactor.

In this example, the HF RF power was set at 1000 W and LF RF power at 600 W in a Novellus "Vector®" chamber. A chamber pressure of 5.0 Torr was used in this process. The gas mixture of liquid TMSA flow rate of 2.5 ml/min and $CO_2$ flow rate of 4000 sccm was used during PECVD deposition at FIG. 14 provides a simple block diagram depicting various reactor components arranged for implementing the present invention. As shown, a reactor 1400 includes a process chamber 1424, which encloses other components of the reactor and serves to contain the plasma generated by a capacitor type system including a showerhead 1414 working in conjunction with a grounded heater block 1420. A high-frequency RF generator 1402 and a low-frequency RF generator 1404 are connected to a matching network 1406 that, in turn is connected to showerhead 1414. The power and frequency supplied by matching network 1406 is sufficient to generate a plasma from the process gas, for example 800 W total energy.

Within the reactor, a wafer pedestal 1418 supports a substrate 1416

The process gases are introduced via inlet 1412. Multiple source gas lines 1410 are connected to manifold 1408. The gases may be premixed or not. Appropriate valving and mass flow control mechanisms are employed to ensure that the correct gases are delivered during the deposition and plasma treatment phases of the process. In some embodiments, the sonic front caused by a process gas entering the chamber will itself cause the gas to rapidly disperse in all directions—including toward the substrate.

Process gases exit chamber 1400 via an outlet 1422. A vacuum pump 1426 (e.g., a turbomolecular pump) typically draws process gases out and maintains a suitably low pressure within the reactor.

Applications

This invention broadly applies to deposition of low-k low residual stress CDO dielectric material on any type substrate. In many cases, however, the CDO dielectric material will be used in integrated circuits or other electronic devices. A preferred use for the CDO films of this invention is for interlayer dielectric (ILD) applications (including both interlevel dielectrics (between active devices and the first metallization layer and intermetal dielectrics ("IMD" between adjacent metallization layers)). In these applications, the CDO films serve to replace conventional silicon dioxide or fluorinated silica glass (FSG) materials. Examples of non-ILD applications include barrier and etch-stop layers. In conventional systems, these layers are sometimes provided in the form of oxygen-doped carbides (which have a refractive index value of not greater than about 1.6.)

The ultimate thickness of a CDO dielectric film produced in accordance with this invention depends upon the application. For example, the final thickness for an interlayer dielectric or packaging application may range up to about 2 to 3 microns. In some cases, extra thickness is required to provide some amount of sacrificial layer to accommodate a subsequent planarization step.

In a preferred embodiment, the CDO films produced in accordance with this invention are used in multiple metallization layers. Such devices may have, for example, five or more metallization layers and five or more associated CDO films.

Other Embodiments

While this invention has been described in terms of certain embodiments, there are various alterations, modifications, permutations, and substitute equivalents, which fall within the scope of this invention. It should also be noted that there are many alternative ways of implementing the methods and apparatuses of the present invention. Further, there are numerous applications of the present invention, both inside and outside the integrated circuit fabrication arena. It is therefore intended that the following appended claims be interpreted as including all such alterations, modifications, permutations, and substitute equivalents as fall within the true spirit and scope of the present invention.

What is claimed is:

1. A method of preparing a carbon doped oxide dielectric layer having a low dielectric constant and low residual stress, the method comprising:
   providing a substrate to a deposition chamber;
   providing an unsaturated carbon doped oxide precursor comprising at least one carbon-carbon triple bond to the deposition chamber;
   igniting and maintaining a plasma in a deposition chamber using radio frequency power having high frequency and low frequency components, wherein at least about 2 percent of total radio frequency power is provided by the low frequency component, which has a frequency of between about 100 kHz and 600 kHz; and
   depositing the carbon doped dielectric layer under conditions in which the dielectric layer has a residual stress of magnitude less than about 35 MPa and wherein the dielectric constant of the carbon doped oxide dielectric layer is not greater than about 3.

2. The method of claim 1, wherein the radio frequency power has a high frequency component in the range of between about 2 MHz and 60 MHz.

3. The method of claim 1, wherein the low frequency component of the radio frequency power has a power of between about 0.02 and 20 Watts/cm$^2$ of substrate surface area.

4. The method of claim 1, further comprising pulsing the high frequency component of the radio frequency power delivered to the chamber at a frequency of between about 500 Hz and 10 kHz during deposition.

5. The method of claim 4, wherein the pulsing has a duty cycle of between about 20 and 80%.

6. The method of claim 1, wherein the substrate is maintained at a temperature of between about 300 and 425 degrees C. during depositing of the carbon doped oxide dielectric layer.

7. The method of claim 1, wherein the substrate is maintained at a temperature of between about 300 and 400 degrees C. during the depositing of the carbon doped dielectric layer.

8. The method of claim 1, wherein the deposition chamber is maintained at a pressure of between about 2 and 20 Torr during deposition of the carbon doped oxide dielectric layer.

9. The method of claim 1, wherein the deposition chamber is maintained at a pressure of between about 2 and 10 Torr during deposition of the carbon doped oxide dielectric layer.

10. The method of claim 1, wherein the carbon doped oxide dielectric layer has a dielectric constant of not greater than about 2.8 and a film stress of less than about 30 MPa.

11. The method of claim 1, wherein the carbon doped oxide dielectric layer has a modulus of at least about 3 GPa.

12. The method of claim 1, wherein the deposition chamber comprises a showerhead that serves as one plate of a plasma producing capacitor and a grounded block that serves as a second plate of the plasma producing capacitor.

13. The method of claim 12, wherein a separation gap between the showerhead and the block is maintained at a distance of between about 5 mm and 100 mm.

14. The method of claim 1, wherein the carbon doped oxide precursor is selected from the group consisting of alkylsilanes, alkoxysilanes, linear siloxanes and cyclic siloxanes.

15. The method of claim 1, wherein the carbon doped oxide dielectric precursor comprises a compound selected from the group consisting of ethynyltrimethylsilane (ETMS), propargyltrimethylsilane (PTMS), propargyloxytrimethylsilane (POTMS), bis(trimethylsilyl)acetylene (BTMSA), 1,3-diethynyltetramethyldisiloxane (DTDS), dimethylmethoxysilaneacetylene (DMMOSA), methyldimethoxysilaneacetylene (MDMOSA), dimethylethoxysilaneacetylene (DMEOSA), methyldiethoxysilaneacetylene (MDEOSA), ethyldiethoxysilaneacetylene (EDEOSA), dimethylsilanediacetylene (DMSDA), methylsilane-triacetylene (MSTA), and tetra acetylene silane (TAS).

16. The method of claim 1 wherein igniting and maintaining a plasma in a deposition chamber comprises using high frequency radio frequency power of between about 2 MHz and 60 MHz; and
wherein depositing the carbon doped dielectric layer comprises maintaining the deposition chamber at a pressure of between about 2 and 20 Torr, and wherein the deposition chamber comprises a showerhead that serves as one plate of a plasma producing capacitor and a grounded block that serves as a second plate of the plasma producing capacitor, with a separation distance of about 5 mm to 100 mm between the showerhead and the block.

17. The method of claim 1 wherein the deposited carbon doped oxide layer is an interlayer dielectric (ILD) in a partially or fully fabricated semiconductor device.

18. The method of claim 1 the wherein the deposited carbon doped oxide layer has a carbon-carbon triple bond to silicon oxide bond ratio of about 0.05% to 20% based on FTIR peak area.

19. A method of preparing an electronic device comprising at least 5 metallization layers, for each metallization layer, the method comprising:
(a) forming a carbon doped oxide dielectric layer by
providing a partially fabricated electronic device to a deposition chamber;
providing a carbon doped oxide precursor to the deposition chamber, wherein the precursor comprises a molecule having at least one carbon-carbon triple bond;
igniting and maintaining a plasma in a deposition chamber using radio frequency power having high frequency and low frequency components, wherein at least about 2 percent of total radio frequency power is provided by the low frequency component, which has a frequency of between about 100 kHz and 600 kHz; and
depositing the carbon doped oxide dielectric layer under conditions in which the dielectric layer has a residual tensile or compressive stress of magnitude less than about 35 MPa and a dielectric constant of not greater than about 3; and
(b) forming conductive lines in the carbon doped dielectric layer.

20. The method of claim 19, wherein the radio frequency power has a high frequency component in the range of between about 2 MHz and 60 MHz.

21. The method of claim 19, further comprising pulsing the high frequency component of the radio frequency power delivered to the chamber at a frequency of between about 500 Hz and 10 kHz during deposition.

22. The method of claim 19, wherein the substrate is maintained at a temperature of between about 300 and 425 degrees C. during the depositing of the carbon doped dielectric layer.

23. The method of claim 19, wherein the deposition chamber is maintained at a pressure of between about 2 and 10 Torr during deposition of the carbon doped oxide dielectric layer.

24. The method of claim 19, wherein the carbon doped oxide dielectric layer has a dielectric constant of not greater than about 2.8 and a film tensile or compressive stress of not greater than about 20 MPa.

25. The method of claim 19, wherein the deposition chamber comprises a showerhead that serves as one plate of a plasma producing capacitor and a grounded block that serves as a second plate of the plasma producing capacitor.

26. The method of claim 25, wherein the separation gap between the showerhead and the block is maintained at a distance of between about 5 mm and 100 mm.

27. The method of claim 19, wherein the carbon doped oxide precursor is selected from the group consisting of alkylsilanes, alkoxysilanes, linear siloxanes and cyclic siloxanes.

28. The method of claim 19, wherein the substrate is maintained at a temperature of between about 300 and 350 degrees C. during the depositing of the carbon doped dielectric layer.

29. A method of preparing a carbon doped oxide dielectric layer having a low dielectric constant and low residual stress, the method comprising:
providing a substrate to a deposition chamber;
providing a carbon doped oxide precursor to the deposition chamber, wherein the precursor comprises a molecule having at least one carbon-carbon triple bond;
igniting and maintaining a plasma in a deposition chamber using high frequency radio frequency power of between about 2 MHz and 60 MHz;
pulsing the high frequency component of the radio frequency power delivered to the chamber at a frequency of between about 500 Hz and 10 kHz during deposition; and
depositing the carbon doped dielectric layer under conditions in which the dielectric layer has a residual tensile or compressive stress magnitude of less than about 35 MPa, and a dielectric constant of not greater than about 3.

30. The method of claim 29, wherein the pulsing has a duty cycle of between about 20 and 80%.

* * * * *